(12) United States Patent
Nakamura et al.

(10) Patent No.: US 8,450,824 B2
(45) Date of Patent: May 28, 2013

(54) OPTICALLY TRANSMISSIVE METAL ELECTRODE, ELECTRONIC DEVICE, AND OPTICAL DEVICE

(75) Inventors: Kenji Nakamura, Kanagawa-ken (JP); Akira Fujimoto, Kanagawa-ken (JP); Tsutomu Nakanishi, Tokyo (JP); Ryota Kitagawa, Tokyo (JP); Shinji Nunotani, Fukuoka-ken (JP); Takanobu Kamakura, Fukuoka-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/405,935

(22) Filed: Feb. 27, 2012

(65) Prior Publication Data

US 2013/0075762 A1    Mar. 28, 2013

(30) Foreign Application Priority Data

Sep. 26, 2011    (JP) ................. 2011-209112

(51) Int. Cl.
*H01L 27/146*    (2006.01)
(52) U.S. Cl.
USPC ........................................ 257/448; 257/432
(58) Field of Classification Search
USPC .............. 257/81, 91, 99, 431, 432, 448, 773, 257/775, 776
See application file for complete search history.

(56) References Cited

U.S. PATENT DOCUMENTS

| | | | | |
|---|---|---|---|---|
| 8,279,145 | B2 * | 10/2012 | Cok et al. ................... | 345/82 |
| 2011/0260741 | A1 * | 10/2011 | Weaver et al. ............. | 324/686 |
| 2011/0261009 | A1 * | 10/2011 | Inagaki et al. ............ | 345/174 |
| 2013/0010235 | A1 * | 1/2013 | Hirosawa et al. .......... | 349/96 |

FOREIGN PATENT DOCUMENTS

| | | |
|---|---|---|
| JP | 2009-199990 | 9/2009 |
| JP | 2009-253016 | 10/2009 |

OTHER PUBLICATIONS

Minami, T., "Transparent conducting oxide semiconductors for transparent electrodes," Semicond. Sci. Technol., vol. 20, pp. S35-S44 (2005).
Chen, Q. et al., "High transmission and low color cross-talk plasmonic color filters using triangular-lattice hole arrays in aluminum films," Optics Express, vol. 18, No. 13, pp. 14056-14062 (2010).
Kang, M. G. et al., "Organic Solar Cells Using Nanoimprinted Transparent Metal Electrodes," Adv. Mater., vol. 20, pp. 4408-4413 (2008).

* cited by examiner

*Primary Examiner* — S. V. Clark
(74) *Attorney, Agent, or Firm* — Finnegan, Henderson, Farabow, Garrett & Dunner, L.L.P.

(57) ABSTRACT

According to one embodiment, an optically transmissive metal electrode includes a plurality of first and second metal wires. The first metal wires are disposed along a first direction, and extend along a second direction intersecting the first direction. The second metal wires are disposed along a third direction parallel with a plane including the first and second directions and intersecting the first direction, contact the first metal wires, and extend along a fourth direction parallel with the plane and intersecting the third direction. A first pitch between centers of the first metal wires is not more than a shortest wavelength in a waveband including visible light. A second pitch between centers of the second metal wires exceeds a longest wavelength in the waveband. A thickness of the first and second metal wires along a direction vertical to the plane is not more than the shortest wavelength.

20 Claims, 12 Drawing Sheets

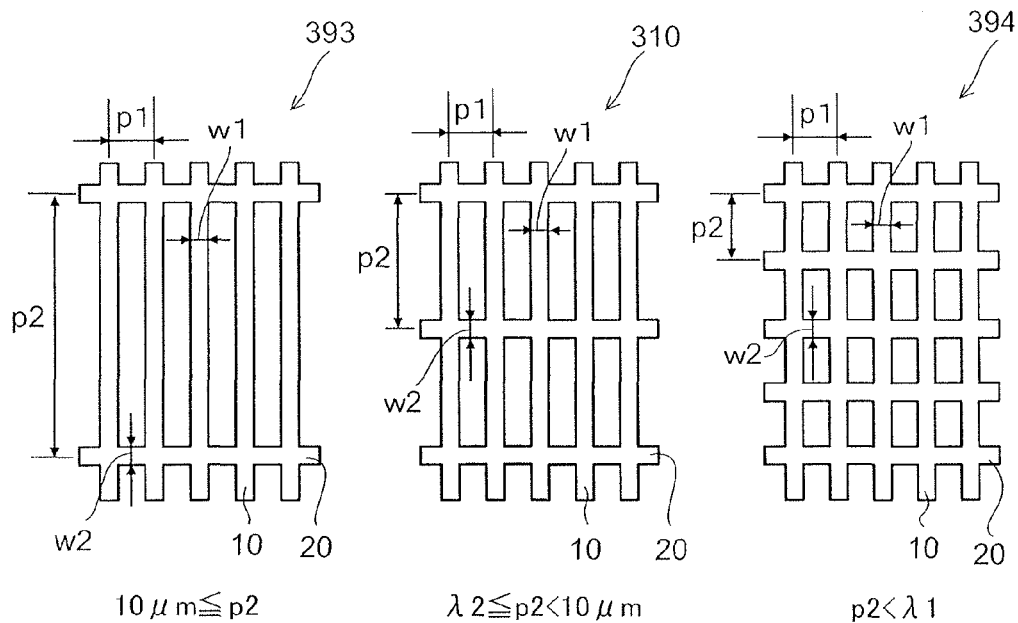
$10\mu m \leqq p2$
FIG. 5A
$\lambda 2 \leqq p2 < 10\mu m$
FIG. 5B
$p2 < \lambda 1$
FIG. 5C
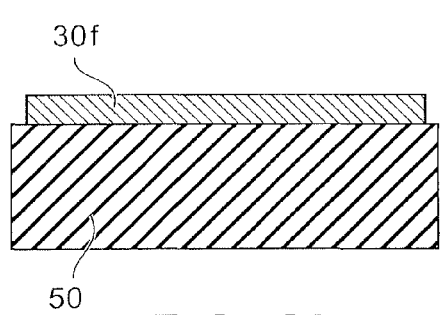
FIG. 6A
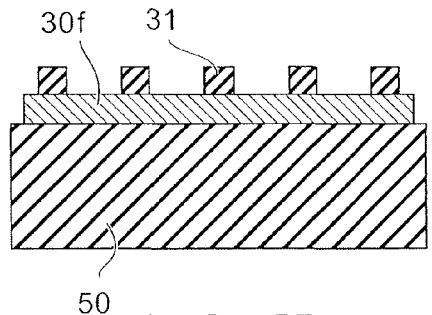
FIG. 6B
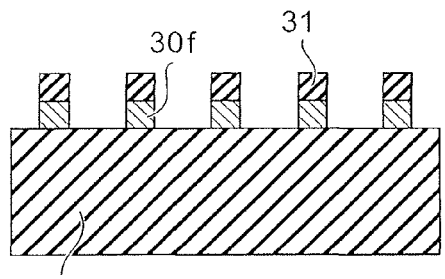
FIG. 6C
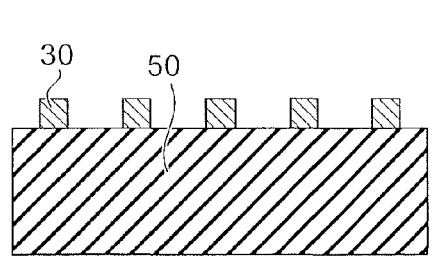
FIG. 6D

OPTICALLY TRANSMISSIVE METAL ELECTRODE, ELECTRONIC DEVICE, AND OPTICAL DEVICE

CROSS-REFERENCE TO RELATED APPLICATIONS

This application is based upon and claims the benefit of priority from the prior Japanese Patent Application No. 2011-209112, filed on Sep. 26, 2011; the entire contents of which are incorporated herein by reference.

FIELD

Embodiments described herein relate generally to an optically transmissive metal electrode, an electronic device, and an optical device.

BACKGROUND

In electronic devices such as a semiconductor light emitting device, a photoelectric converter, and a display device, an electrode that transmits light is used. For such an electrode, ITO (Indium Tin Oxide), for example, is used, which is one of oxide conductive materials. The transmittance in a visible light region when an ITO film is formed on a glass substrate is about 80 percent. On the other hand, the sheet resistance in the region is about 10 ohm/square or more and 100 ohm/square or less, and the sheet resistance is higher than the sheet resistance of an electrode made of a typical metal material.

On the other hand, there are a metal nano structure unit in which circular apertures is formed in a metal thin film at regular intervals, and an optically transparent electrode using fine metal wires. However, there is plenty of room for improvement in order to obtain a high transmittance in a wide wavelength range while keeping a low sheet resistance even though these configurations are used.

BRIEF DESCRIPTION OF THE DRAWINGS

FIG. 5A to FIG. 5C are schematic plan views illustrating optically transmissive metal electrodes;

FIG. 6A to FIG. 6D are schematic cross-sectional views illustrating process steps of a manufacturing method for the optically transmissive metal electrode according to the first embodiment;

DETAILED DESCRIPTION

Figure 1A:
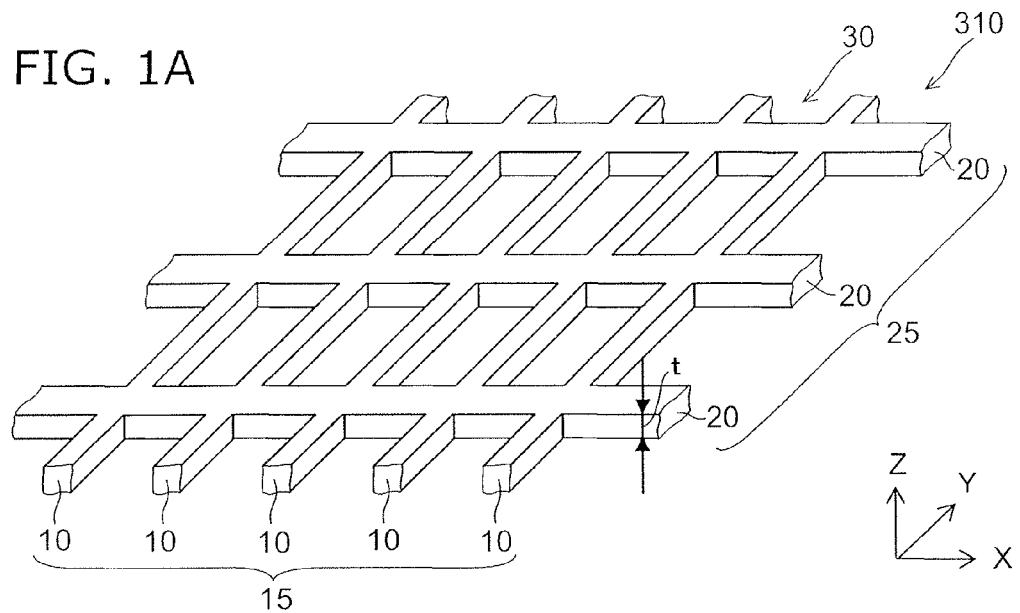
FIG. 1A and FIG. 1B are schematic views illustrating an optically transmissive metal electrode according to a first embodiment.

According to one embodiment, an optically transmissive metal electrode includes a plurality of first metal wires and a plurality of second metal wires. The first metal wires are disposed side by side along a first direction. Each of the first metal wires extends along a second direction intersecting the first direction. The second metal wires are disposed side by side along a third direction parallel with a plane including the first direction and the second direction and intersecting the first direction. The second metal wires contact the first metal wires. Each of the second metal wires extends along a fourth direction parallel with the plane and intersecting the third direction. A first pitch between centers of the first metal wires in the first direction is not more than a shortest wavelength in a waveband including visible light. A second pitch between centers of the second metal wires in the third direction exceeds a longest wavelength in the waveband. A thickness of the first metal wires and the second metal wires along a direction vertical to the plane is not more than the shortest wavelength.

According to another embodiment, an electronic device includes an optically transmissive metal electrode, and a structure unit supplied with electric charges through the optically transmissive metal electrode. The optically transmissive metal electrode includes a plurality of first metal wires and a plurality of second metal wires. The first metal wires are disposed side by side along a first direction. Each of the first metal wires extends along a second direction intersecting the first direction. The second metal wires are disposed side by side along a third direction parallel with a plane including the first direction and the second direction and intersecting the first direction. The second metal wires contact the first metal wires. Each of the second metal wires extends along a fourth direction parallel with the plane and intersecting the third direction. A first pitch between centers of the first metal wires in the first direction is not more than a shortest wavelength in a waveband including visible light. A second pitch between centers of the second metal wires in the third direction exceeds a longest wavelength in the waveband. A thickness of the first metal wires and the second metal wires along a direction vertical to the plane is not more than the shortest wavelength.

According to another embodiment, an optical device includes an optically transmissive metal electrode, and an optical member stacked on the optically transmissive metal electrode. The optical member receives light transmitted through the optically transmissive metal electrode. The optically transmissive metal electrode includes a plurality of first metal wires and a plurality of second metal wires. The first metal wires are disposed side by side along a first direction. Each of first metal wires extends along a second direction intersecting the first direction. The second metal wires are disposed side by side along a third direction parallel with a plane including the first direction and the second direction and intersecting the first direction. The second metal wires contact the first metal wires. Each of the second metal wires extends along a fourth direction parallel with the plane and intersecting the third direction. A first pitch between centers of the first metal wires in the first direction is not more than a shortest wavelength in a waveband including visible light. A second pitch between centers of the second metal wires in the third direction exceeds a longest wavelength in the waveband. A thickness of the first metal wires and the second metal wires along a direction vertical to the plane is not more than the shortest wavelength.

Various embodiments will be described hereinafter with reference to the accompanying drawings.

The drawings are schematic or conceptual; and the ratio of size between portions is not necessarily the same as the actual values thereof. Further, the dimensions and proportional coefficients may be illustrated differently among drawings, even for identical portions.

In the specification and drawings, components similar to those described or illustrated in a drawing thereinabove are marked with like reference numerals, and a detailed description is omitted as appropriate.

First Embodiment

Figure 1B:
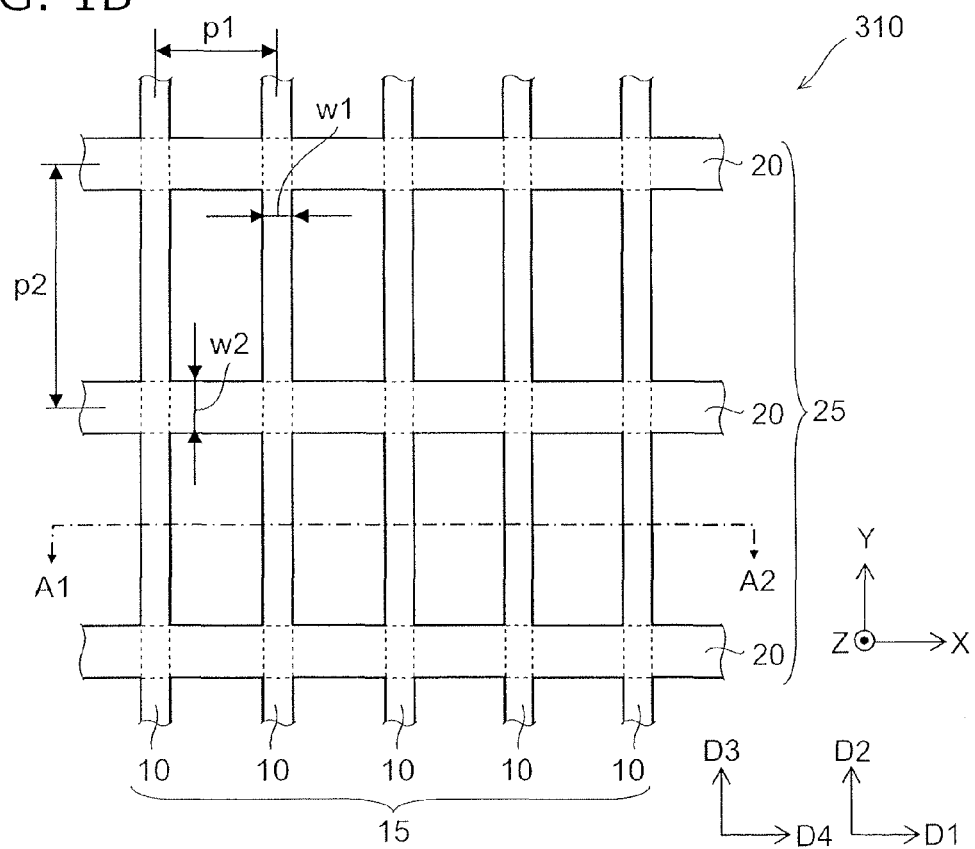

FIG. 1A and FIG. 1B are schematic views illustrating the configuration of an optically transmissive metal electrode according to a first embodiment.

FIG. 1A is a perspective view. FIG. 1B is a plan view.

As illustrated in FIG. 1A and FIG. 1B, an optically transmissive metal electrode 310 according to the embodiment includes a plurality of first metal wires 10 and a plurality of second metal wires 20.

The plurality of first metal wires 10 are disposed side by side along a first direction D1. Each of the plurality of first metal wires 10 extends along a second direction D2 intersecting the first direction D1. In this example, the second direction D2 is vertical to the first direction D1.

For example, suppose that a plane including the first direction D1 and the second direction D2 is an X-Y plane. A single direction parallel with the X-Y plane is an X-axis direction. A single direction parallel with the X-Y plane and vertical to the X-axis direction is a Y-axis direction. A direction vertical to the X-axis direction and the Y-axis direction is a Z-axis direction.

For example, the first direction D1 is parallel with the X-axis direction. The second direction D2 is parallel with the Y-axis direction. A direction from one of the plurality of first metal wires 10 to another one of the plurality of first metal wires 10 is the first direction D1.

The plurality of second metal wires 20 are disposed side by side along the third direction D3. The plurality of second metal wires 20 contact the plurality of first metal wires 10. The third direction D3 intersects the first direction D1. Each of the plurality of second metal wires 20 extends along a fourth direction D4 intersecting the third direction D3. The third direction D3 and the fourth direction D4 are parallel with the plane (the X-Y plane) including the first direction D1 and the second direction D2.

In this example, the fourth direction D4 is vertical to the third direction D3. In this example, the third direction D3 is parallel with the Y-axis direction. The fourth direction D4 is parallel with the X-axis direction. Therefore, the third direction D3 is vertical to the first direction D1. However, as described later, the embodiment is not limited thereto. The third direction D3 may not be parallel with the first direction D1.

In the following, for simplifying the explanation, the case will be described where the first direction D1 is parallel with the X-axis direction, the second direction D2 is parallel with the Y-axis direction, the third direction D3 is parallel with the Y-axis direction, and the fourth direction D4 is parallel with the X-axis direction.

For simplifying the explanation, the plurality of first metal wires 10 are appropriately called a first array 15, and the plurality of second metal wires 20 are appropriately called a second array 25. The plurality of first metal wires 10 and the plurality of second metal wires 20 are provided substantially in the same layer (a layer parallel with the X-Y plane). The plurality of first metal wires 10 and the plurality of second metal wires 20 are together called a metal electrode layer 30. The metal electrode layer 30 is a layer working as an electrode, for example. The metal electrode layer 30 includes the first array 15 and the second array 25. The first array 15 includes the plurality of first metal wires 10. The second array 25 includes the plurality of second metal wires 20.

Suppose that a pitch between the centers of the plurality of first metal wires 10 in the first direction D1 is a first pitch p1. The pitch (the first pitch p1) between the centers of the plurality of first metal wires 10 in the first direction D1 may not be the same in all of the plurality of first metal wires 10. In the following, for simplifying the explanation, an explanation will be given where the first pitch p1 is the same in all of the plurality of first metal wires 10. At this time, the first pitch p1 corresponds to a pitch (a period) to provide the first metal wire 10.

When the first pitch p1 is different in the plurality of first metal wires 10, a mean value is used.

Suppose that the width of each of the plurality of first metal wires 10 along the first direction D1 is a first width w1. The width (the first width w1) of each of the plurality of first metal wires 10 along the first direction D1 may not be the same in all of the plurality of first metal wires 10. In the following, for simplifying the explanation, an explanation will be given where the first width w1 is the same in all of the plurality of first metal wires 10.

When the first width w1 is different in the plurality of first metal wires 10, a mean value is used.

Suppose that a pitch between the centers of the plurality of second metal wires 20 in the third direction D3 is a second pitch p2. The pitch (the second pitch p2) between the centers of the plurality of second metal wires 20 in the third direction D3 may not be the same in all of the plurality of second metal wires 20. In the following, for simplifying the explanation, an explanation will be given where the second pitch p2 is the same in all of the plurality of second metal wires 20. At this time, the second pitch p2 corresponds to a pitch (a period) to provide the second metal wire 20.

When the second pitch p2 is different in the plurality of second metal wires 20, a mean value is used.

Suppose that the width of each of the plurality of second metal wires 20 along the third direction D3 is a second width w2. The width (the second width w2) of each of the plurality of second metal wires 20 along the third direction D3 may not be the same in all of the plurality of second metal wires 20. In the following, for simplifying the explanation, an explanation will be given where the second width w2 is the same in all of the plurality of second metal wires 20.

When the second width w2 is different in the plurality of second metal wires 20, a mean value is used.

Suppose that the thickness of the first metal wire 10 along the Z-axis direction (a direction vertical to the plane including the first direction D1 and the second direction D2) is a first thickness. The thickness of the second metal wire 20 along the Z-axis direction is a second thickness. The first thickness is not necessarily the same as the second thickness. In the embodiment, the first thickness is the same as the second thickness. In the following, an explanation will be given where the first thickness and the second thickness are a thickness t.

In the embodiment, the first pitch p1 is a predetermined length or less. The second pitch p2 exceeds the predetermined length.

Here, the optically transmissive metal electrode 310 transmits light at a specific wavelength. The waveband of this light includes the wavelength of visible light, for example. In this case, suppose that the wavelength of visible light is 400 nanometers (nm) or more and 700 nm or less. For example, the optically transmissive metal electrode 310 transmits visible light. The optically transmissive metal electrode 310 transmits infrared light depending on the applications. In the specification, suppose that the wavelength of infrared light is more than 700 nm and 1 micrometer (µm) or less.

The optically transmissive metal electrode 310 according to the embodiment transmits light in a waveband having a wavelength of 400 nm or more and 1 µm or less, for example. This waveband corresponds to the wavelength range of light to be transmitted. This waveband includes visible light. Suppose that the shortest wavelength in this waveband is called a shortest wavelength λ1. The longest wavelength in this waveband is called a longest wavelength λ2. The shortest wavelength λ1 and the longest wavelength λ2 can be determined depending on the applications. When a target is a waveband having a wavelength of 400 nm or more and 1 µm or less, the shortest wavelength λ1 is 400 nm, and the longest wavelength λ2 is 1 µm. When a target is a waveband having a wavelength of 400 nm or more and 700 nm or less, the shortest wavelength λ1 is 400 nm, and the longest wavelength λ2 may be 700 nm.

In the embodiment, the first pitch p1 is the shortest wavelength λ1 or less in the waveband including visible light. The second pitch p2 exceeds the longest wavelength λ2 in the waveband. The thickness t of the first metal wire 10 and the second metal wire 20 is the shortest wavelength λ1 or less.

Thus, it is possible to provide an optically transmissive metal electrode having a low sheet resistance and a high transmittance in a wide wavelength range.

The first pitch p1 is 10 nm or more and 400 or less nm, for example. The second pitch p2 is 1 µm or more and less than 10 µm, for example. The thickness t is 5 nm or more and 400 nm or less.

A metal is used for the first metal wire 10 and the second metal wire 20. The first metal wire 10 and the second metal wire 20 include at least one of gold, silver, copper, aluminum, nickel, lead, zinc, platinum, cobalt, magnesium, chromium, tungsten, and palladium, for example. An alloy including the metal may be used for the first metal wire 10 and the second metal wire 20. A metal is used for the first metal wire 10 and the second metal wire 20, so that it is possible to obtain a low sheet resistance.

These metal materials have a resistivity lower than the resistivity of a transparent oxide semiconductor, for example. Thus, it is possible to reduce the sheet resistance of the optically transmissive metal electrode 310 below the sheet resistance of the transparent electrode using a transparent oxide semiconductor.

Figure 2A:
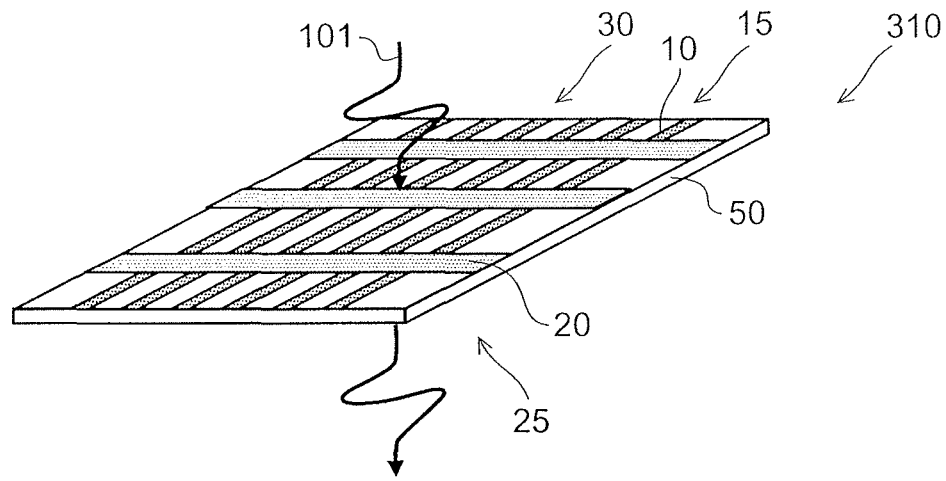
FIG. 2A and FIG. 2B are schematic views illustrating the characteristics of the optically transmissive metal electrode according to the first embodiment.
Figure 2B:
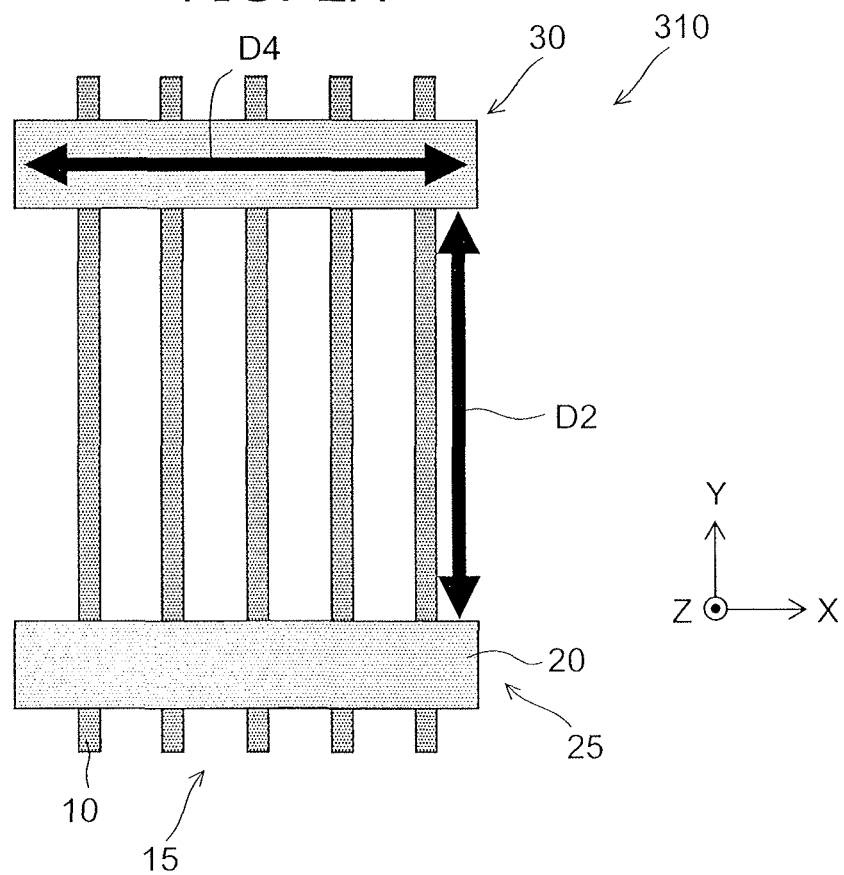

FIG. 2A and FIG. 2B are schematic views illustrating the characteristics of the optically transmissive metal electrode according to the first embodiment.

FIG. 2A is a schematic perspective view. FIG. 2B is a plan view.

As illustrated in FIG. 2A, the optically transmissive metal electrode 310 according to the embodiment is provided on a substrate 50, for example.

For the substrate 50, such a substrate can be used, including a transparent substrate such as a silica substrate, a glass substrate, and a sapphire substrate; a semiconductor substrate such as a silicon substrate, a gallium arsenide substrate, a gallium phosphide substrate, and a gallium nitride substrate; and a plastic substrate such as polyethylene terephthalate, for example. For the substrate 50, such a layer can be used as a silica layer, a glass layer, a sapphire layer, a semiconductor layer (a silicon layer, a gallium arsenide layer, a gallium phosphide layer, and a gallium nitride layer), and an organic material layer, for example. However, the embodiment is not limited thereto. The material of the substrate 50 is optional.

As illustrated in FIG. 2A, light 101 having an electric field in the direction vertical to the direction in which the first array 15 extends is transmitted through the first array 15. The first array 15 acts as a wire grid polarizer, for example, to the light 101 having entered the first array 15. As described above, the optically transmissive metal electrode 310 is optically transparent.

As illustrated in FIG. 4B, the first metal wire 10 included in the first array 15 has a high conductivity based on metal along the direction in which the first metal wire 10 extends (in the second direction D2, and in this example, in the Y-axis direction). The second metal wire 20 included in the second array 25 has a high conductivity based on metal along the direction in which the second metal wire 20 extends (in the fourth direction D4, and in this example, in the X-axis direction). As described above, in the metal electrode layer 30, a high conductivity can be obtained in the plane (the X-Y plane) including the second direction D2 and the fourth direction D4.

On the other hand, there is a configuration (a first reference sample) using a metal nano structure unit in which circular apertures in the size of a few to a few hundred nanometers are formed in a metal thin film periodically. When light enters a metal thin film having nano apertures, a localized electric field is produced at the edge of the nano aperture caused by front surface electric charges. Since this localized electric field is similarly vibrated as the incident electric field, light is again emitted. Thus, the phenomenon of optically extraordinary transmission occurs. The light again emitted from each nano aperture interferes with the light emitted from the adjacent nano aperture, so that the transmittance of light at a specific wavelength increases. Thus, the transmission spectrum of this metal nano structure unit has a peak at a specific wavelength depending on the material of the metal thin film, the period and the diameter of the circular nano apertures, and the dielectric constant of the surrounding medium. At the specific wavelength, a transmittance equal to the aperture ratio or more can be obtained. A peak value is taken at the specific wavelength, and then a reflectance is considerably increased on the long wavelength side more than in the peak wavelength. Therefore, when this metal nano structure unit is used for an optically transparent electrode, it is difficult to obtain a high transparency in the entire range of the wavelength of visible light.

On the contrary, as described later, the optically transmissive metal electrode 310 according to the embodiment has a high optical transparency in a wide wavelength range.

On the other hand, there is a metal electrode using a fine metal wire in micrometer size (a second reference sample). This metal electrode is used for an optically transparent electrode, and apertures are widely formed to increase optical transparency, therefore optical transparency is high. Thus, the sheet resistance is higher than the sheet resistance of a transparent oxide semiconductor. In the metal electrode in this structure, although the apertures transmit light, the metal portion shields light. The optical characteristics of the metal electrode in this structure match the optical characteristics of a flat metal thin film having the same volume as the volume of the metal portion.

A sheet resistance $R_{sh}$ (ohm/square) of a metal electrode formed of a fine metal wire having such an aperture can be expressed by Equation 1 below, using a resistivity p (Ωm: ohm meter) of metal, the thickness t (m: meter) of a metal electrode, and a occupancy θ of a fine metal wire per unit area.

$$R_{sh}=(\rho/t)\times(1/\theta) \quad (1)$$

As revealed from Equation 1, when the occupancy θ of the fine metal wire is reduced for obtaining a high light transmittance, the sheet resistance $R_{sh}$ is increased.

Figure 3:
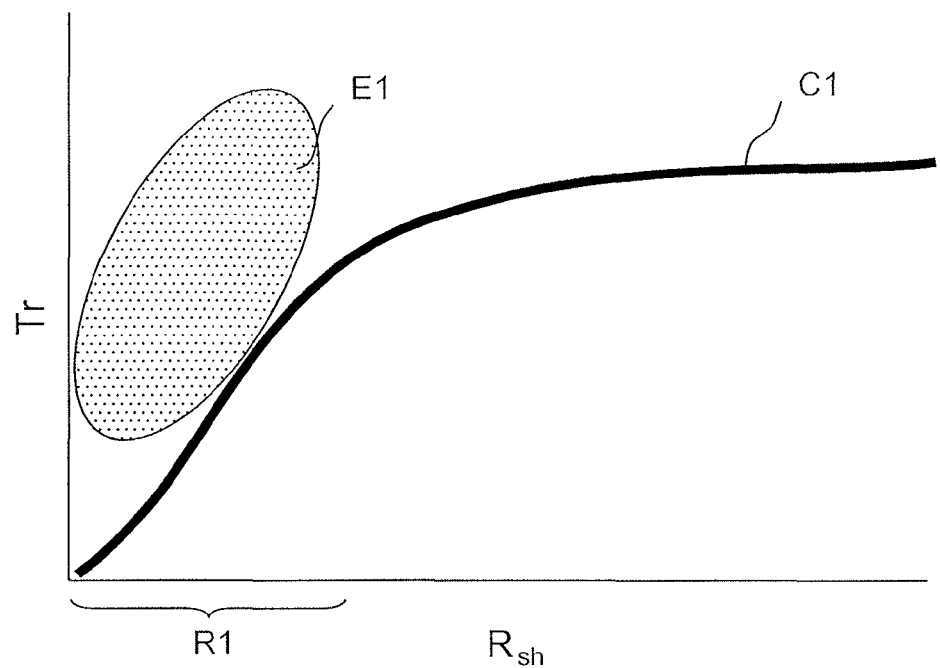
FIG. 3 is a graph illustrating the characteristics of the metal electrode layer.

FIG. 3 is a graph illustrating the characteristics of the metal electrode layer.

The horizontal axis shown in FIG. 3 expresses the sheet resistance $R_{sh}$. The vertical axis expresses a light transmittance Tr. A curve (characteristic C1) shown in FIG. 3 expresses changes in the light transmittance Tr when the sheet resistance $R_{sh}$ is changed as the occupancy θ of the fine metal wire and the thickness t of the metal electrode are varied in the metal electrode according to the second reference sample.

As illustrated in FIG. 3, in the metal electrode according to the second reference sample having the characteristics of Equation 1, when a high light transmittance Tr is desired to be obtained, the sheet resistance $R_{sh}$ is increased. More particularly, in a region R1 where the sheet resistance $R_{sh}$ is high, the light transmittance Tr is suddenly reduced.

The optically transmissive metal electrode 310 according to the embodiment has a characteristic E1 illustrated in FIG. 3. In the characteristic E1, the light transmittance Tr higher than in the characteristic C1 of the second reference sample is obtained in a region R1 where the sheet resistance $R_{sh}$ is low. As described above, in the optically transmissive metal electrode 310, it is possible to obtain a low sheet resistance $R_{sh}$ and a high light transmittance Tr at the same time.

Exemplary characteristics of the optically transmissive metal electrode 310 according to the embodiment will be further explained.

In the optically transmissive metal electrode 310, a structure of a metal wire grid polarizer (in the following, appropriately referred to a "grid polarizer" for simplification), for example, is used. Thus, a high light transparency can be obtained. The grid polarizer has a structure in which fine metal wires are arranged at regular intervals, for example. A high light transparency can be obtained in a wide wavelength range for polarized light having an electric field vertical to the direction in which the fine metal wires extend.

Figure 4:
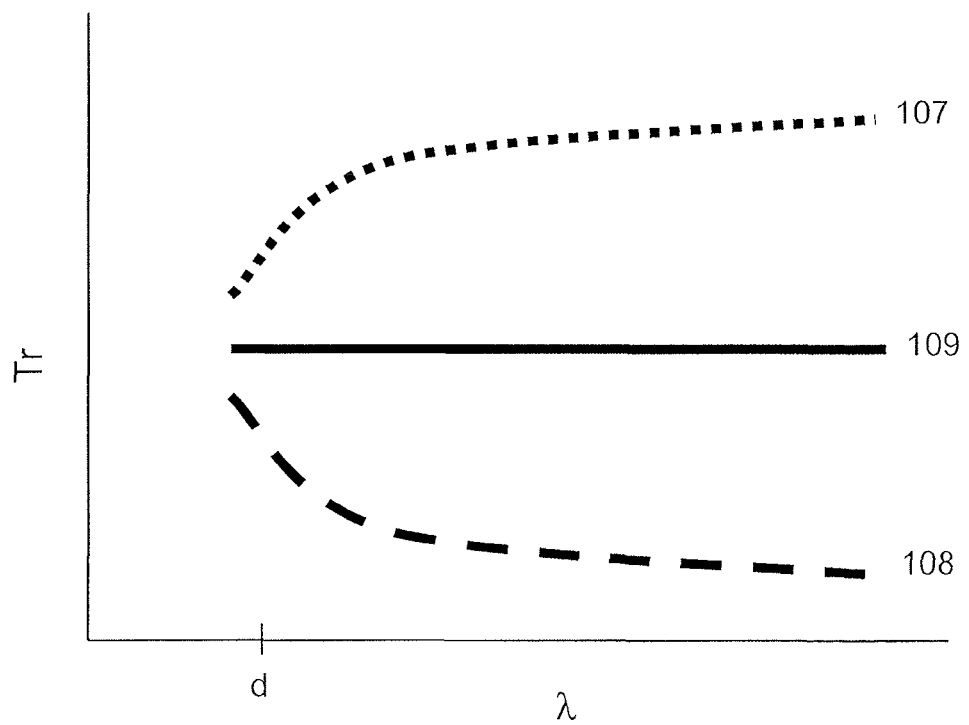
FIG. 4 is a graph illustrating the characteristics of the optically transmissive metal electrode according to the first embodiment.

FIG. 4 is a graph illustrating the characteristics of the optically transmissive metal electrode according to the first embodiment.

The horizontal axis shown in FIG. 4 expresses the wavelength λ of light. The vertical axis expresses the light transmittance Tr.

FIG. 4 illustrates the light transmittance (a normal transmittance 107) of polarized light having an electric field vertical to the direction in which the first metal wire 10 extends and the light transmittance (a parallel transmittance 108) of polarized light having an electric field parallel with the direction in which the first metal wires 10 extend. The light transmittance (a total transmittance 109) of light in all polarization directions is shown.

As illustrated in FIG. 4, the normal transmittance 107 is increased in a predetermined length d or more. On the other hand, the parallel transmittance 108 is reduced in the predetermined length d or more. In the optically transmissive metal electrode 310, the total transmittance 109 of the metal electrode layer 30 to all the polarized lights is the average between the spectrum of the normal transmittance 107 and the spectrum of the parallel transmittance 108.

Thus, in the optically transmissive metal electrode 310, it is possible to obtain a high light transmittance Tr with a small wavelength dependency in a wide wavelength range.

Assuming that the grid polarizer is a perfect conductor with no thickness, the light transmittance (the normal transmittance 107) of polarized light having an electric field vertical to the grid polarizer can be expressed by an equation. According to the equation, the transmittance is increased in a region where the period of the grid polarizer is the wavelength of the incident light or less. When the ratio of the width of a fine wire to the period of the grid polarizer is increased, the light transmittance (the normal transmittance 107) of polarized light having an electric field vertical to the grid polarizer is reduced.

Generally, in investigating the characteristics of the light transmittance of the grid polarizer, the fine metal wire of the grid polarizer is treated as a perfect conductor. Thus, the effect of the thickness is not taken into account. The properties of the light transmission characteristics (for example, the parallel transmittance 108) of the grid polarizer for polarized light having an electric field parallel with the direction in which the fine metal wires of the grid polarizer extend are not described correctly.

The inventors found as the result of investigation that the light transmission characteristics of the grid polarizer for polarized light having an electric field parallel with the direction in which the fine metal wires of the grid polarizer extend are almost the same as the characteristics of the light transmittance of a flat metal film having the same volume as the volume of the fine metal wires of the grid polarizer.

In the optically transmissive metal electrode 310 according to the embodiment, if the thickness of the metal electrode layer 30 is the wavelength of targeted light or less, it is possible to obtain a high transmittance for polarized light having an electric field vertical to the direction in which the metal fine wires extend as well as for polarized light having an electric field parallel with the direction in which the fine metal wires extend.

In the optically transmissive metal electrode 310, a high light transmittance Tr can be obtained based on the characteristics of the grid polarizer in the first array 15 (the first metal wires 10), for example. The first pitch p1 of the first metal wires 10 of the first array 15 is set to the wavelength of light passing through the metal electrode layer 30 or less.

For example, in the case where the optically transmissive metal electrode 310 is used for an electrode to transmit visible light, the first pitch p1 of the first metal wires 10 (corresponding to a period) is set to the wavelength of visible light or less. More specifically, the first pitch p1 is set to 400 nm or less.

In the case where the first pitch p1 of the first metal wires 10 is less than 10 nm, manufacture becomes difficult and yields are decreased in terms of nanofabrication. Thus, preferably, the first pitch p1 is 10 nm or more.

On the other hand, the second pitch p2 (corresponding to a period) of the second metal wires 20 is set larger than the wavelength of light to be transmitted through the metal electrode layer 30. Thus, it is possible to suppress the occurrence of the phenomenon of optically extraordinary transmission at a specific wavelength like the first reference sample, and it is possible to operate the first metal wires 10 as a grid polarizer.

For example, in the case where the optically transmissive metal electrode 310 is used for an electrode to transmit visible light, preferably, the second pitch p2 of the second metal wires 20 is 1 μm or more. In the case where the second pitch p2 is 10 μm or more, the first metal wires 10 are excessively long, and the resistance is increased. For example, the resistance of a single aluminum wire having a line width of 100 nm, a thickness of 100 nm, and a length of 40 μm is as high as about 100Ω.

FIG. 5A to FIG. 5C are schematic plan views illustrating the configurations of optically transmissive metal electrodes. As illustrated in FIG. 5A, in an optically transmissive metal electrode 393 according to a third reference sample, the second pitch p2 of a second metal wires 20 (corresponding to a period) is 10 μm or more. As illustrated in FIG. 5B, in the optically transmissive metal electrode 310 according to the embodiment, the second pitch p2 is the longest wavelength λ2 or more and less than 10 μm. As illustrated in FIG. 5C, in an optically transmissive metal electrode 394 according to a fourth reference sample, the second pitch p2 is less than the shortest wavelength λ1.

In the optically transmissive metal electrode 393 according to the third reference sample, although a high light transmittance Tr can be obtained, the sheet resistance $R_{sh}$ is high. In the optically transmissive metal electrode 394 according to the fourth reference sample, although a low sheet resistance $R_{sh}$ can be obtained, the light transmittance Tr is low.

On the contrary, in the optically transmissive metal electrode 310 according to the embodiment, a low sheet resistance $R_{sh}$ and a high light transmittance Tr can be obtained. In the optically transmissive metal electrode 310, the first metal wires 10 working as a grid polarizer, for example, is cross-linked with the second metal wires 20 provided at appropriate pitches, so that it is possible to obtain a low sheet resistance $R_{sh}$ and a high light transmittance Tr.

The sheet resistance $R_{sh}$ of the metal electrode layer 30 including the first array 15 and the second array 25 can be calculated using the aforementioned Equation 1. For example, in the case where silver is used for the metal electrode layer 30, the ratio of the metal wires width to the period in the first array 15 and the second array 25 is 0.1 and the thickness t of the metal electrode layer 30 is 100 nm, the sheet resistance $R_{sh}$ is calculated as about 1.6 ohm/square.

When the thickness of the metal electrode layer 30 is less than 5 nm, the sheet resistance $R_{sh}$ sometimes exceeds 5 ohm/square depending on a metal material for use and the ratio of the metal wire width to the period.

Preferably, the ratio of the metal wire width to the period in the first array 15 and the second array 25 is 0.1 or more and 0.5 or less. When this ratio is less than 0.1, the sheet resistance $R_{sh}$ is sometimes higher than 5 ohm/square depending on a metal material for use and the thickness t.

When the ratio of the first width w1 to the first pitch p1 of the first metal wires 10 is greater than 0.5, the optical transparency of the first metal wires 10, for example, is excessively reduced. When the ratio of the second width w2 to the second pitch p2 of the second metal wires 20 is greater than 0.5, the region responsible for optical transmission in the first array 15 is covered, and the light transmittance Tr is excessively reduced.

In the first array 15, the ratio of the first width w1 to the first pitch p1 is set to 0.1 or more and 0.5 or less. The ratio of the second width w2 to the second pitch p1 is set to 0.1 or more and 0.5 or less. Thus, it is possible that a low sheet resistance $R_{sh}$ and a high light transmittance Tr tend to be obtained.

In the following, an exemplary manufacturing method for the optically transmissive metal electrode will be described. However, the embodiment is not limited to a method explained below. In the embodiment, the manufacturing method for the optically transmissive metal electrode is optional. In the embodiment, in the first array 15, a line-and-space shape at the wavelength of light or less is provided. In order to prepare a structure having such a shape, fine patterning technique is used.

FIG. 6A to FIG. 6D are schematic cross-sectional views illustrating process steps of a manufacturing method for the optically transmissive metal electrode according to the first embodiment.

As illustrated in FIG. 6A, for example, a metal film 30f is formed on the substrate 50. In forming the metal film 30f, such a method is used as vacuum vapor deposition according to resistance heating, electron-beam evaporation, laser evaporation, sputtering, and CVD (Chemical Vapor Deposition), and MBE (Molecular-Beam Epitaxy), for example.

As illustrated in FIG. 6B, a pattern layer 31 is formed, having a shape corresponding to the pattern of the metal electrode layer 30. In forming the pattern layer 31, such a method can be used as light lithography, electron-beam lithography, nanoimprinting, soft imprinting, block polymer lithography, and scanning probe, for example.

As illustrated in FIG. 6C, the pattern layer 31 is used as a mask to process the metal film 30f. For this processing, dry etching, ion milling, focused-ion-beam etching, and so on can be used, for example.

As illustrated in FIG. 6D, the pattern layer 31 is removed. Thus, the metal electrode layer 30 having a predetermined shape is formed. Therefore, the optically transmissive metal electrode 310 is formed.

Figure 7A:
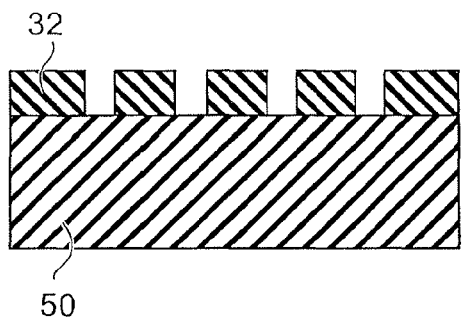
FIG. 7A to FIG. 7C are schematic cross-sectional views illustrating process steps of another manufacturing method for the optically transmissive metal electrode according to the first embodiment.
Figure 7B:
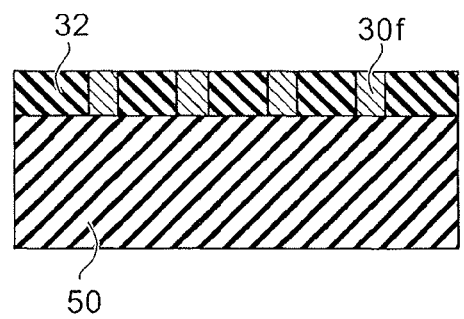
Figure 7C:
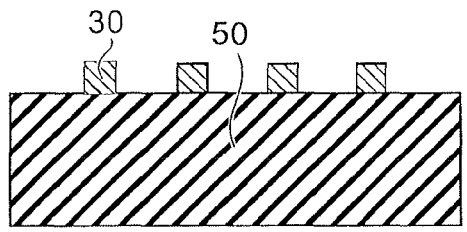

FIG. 7A to FIG. 7C are schematic cross-sectional views illustrating process steps of another manufacturing method for the optically transmissive metal electrode according to the first embodiment.

As illustrated in FIG. 7A, a pattern layer 32 having a shape corresponding to the pattern of the metal electrode layer 30 is formed on the substrate 50, for example. This pattern layer 32 has a pattern that the pattern of the metal electrode layer 30 is inverted. In forming the pattern layer 32, a given method can be used.

As illustrated in FIG. 7B, a metal film 30f is formed. As illustrated in FIG. 7C, the pattern layer 32 is removed. Thus, the metal electrode layer 30 is formed, and the optically transmissive metal electrode 310 is formed. In this manufacturing method, lift-off or plating, for example, is used.

The structure of the metal electrode layer 30 can be observed using an electron microscope, for example. For example, two to ten first metal wires 10 are included in an imaging region for imaging. The first pitch p1 and the first width w1 of the first metal wire 10 can be measured using the obtained electron microscope image. Two to ten second metal wires 20 are included in an imaging region for imaging. The second pitch p2 and the second width w2 of the second metal wires 20 can be measured using the obtained electron microscope image. In these measurements, a mean value and variations can be measured for each of the first pitch p1, the first width w1, the second pitch p2, and the second width w2. As already explained, the obtained mean values are used for these values. It is noted that in the case where a layer such as a dielectric layer, for example, is formed on the metal electrode layer 30, this layer is removed to expose the metal electrode layer 30, as necessary, before the aforementioned electron microscopic observation.

The sheet resistance $R_{sh}$ of the optically transmissive metal electrode 310 can be measured as described below, for example. The metal electrode layer 30 is exposed, as necessary. Several electrode pairs with different distance formed ohmic contact are formed on the metal electrode layer 30. The current-voltage characteristics are measured for each of the electrode pairs for calculating an electric resistance. The measured electric resistances are plotted on coordinates where the horizontal axis expresses the electrode pitch and the vertical axis expresses the electric resistance. The sheet resistance $R_{sh}$ of the optically transmissive metal electrode 310 can be calculated from the slope of an approximate linear line obtained from the plotted points.

In the optically transmissive metal electrode 310, the first array 15 operates as a grid polarizer, for example. The first array 15 shows optical responses in a region about the wavelength of light as the average structure. When irregularities exist in the side portion of the metal wire caused by manufacturing process steps such as etching, for example, such a structure is formed in which the line width of the grid polarizer is unequal, sometimes causing a change in the light transmittance.

The inventors found as the result of investigation that the optical characteristics are not substantially impaired in the range in which variations in the first width w1 of the first metal wires 10 are within plus or minus 25 percent for the mean value of the first width w1.

The second array 25 serves as a function of conducting the first metal wires 10 of the first array 15, for example, with each other at a low resistance. The second width w2 of the second metal wire 20 is set larger than the first width w1 of the first metal wire 10. Thus, the ratio of the irregularities in the side portion of the metal wire in the second array 25 occupies a small amount in the entire ratio, and the influence of the irregularities on the sheet resistance $R_{sh}$ is small.

The inventors found as the result of investigation that the sheet resistance $R_{sh}$ is not substantially affected in the range in which variations in the second width w2 of the second metal wires 20 are within plus or minus 5 percent for the mean value of the second width w2.

In the following, exemplary characteristics of the optically transmissive metal electrode 310 according to the embodiment will be described. The results of computer optical simulation will be explained together with the reference samples as the configurations of the optically transmissive metal electrode 310 are changed. In the optical simulation, rigorous coupled wave analysis is performed. For analysis software for rigorous coupled wave analysis, DiffractMOD made by RSoft Inc. is used.

In this optical simulation, a rectangular parallelepiped that is a substrate and a light source were disposed in a calculation region in which the light source was provided at a position apart from the rectangular parallelepiped in parallel with the rectangular parallelepiped, and light intensity to a plane parallel with the light source was found in the inside of the rectangular parallelepiped.

The metal electrode layer 30 is horizontally disposed on the top face of the rectangular parallelepiped. The metal electrode layer 30 includes ten first metal wires 10 and four second metal wires 20. Each of the first metal wires 10 is provided along the Y-axis direction, and each of the second metal wires 20 is provided along the X-axis direction. In rigorous coupled wave analysis, analysis is performed in the X-axis direction and the Y-axis direction, where the orders of Fourier expansion are ten orders.

The sheet resistance $R_{sh}$ is calculated according to Equation 1 using literature values for the resistivity.

Suppose that the ratio of the first width w1 to the first pitch p1 is a first ratio θ1. The ratio of the second width w2 to the second pitch p2 is a second ratio θ2. Characteristics were found as these values and the thickness t1 were changed.

FIG. 8A to FIG. 8C, FIG. 9A to FIG. 9C, FIG. 10A, and FIG. 10B are graphs illustrating the characteristics of optically transmissive metal electrodes.

The horizontal axis in these drawings expresses the wavelength λ (nm), and the vertical axis expresses the light transmittance Tr. The light transmittance Tr is a transmittance for all polarized lights.

The graphs individually show the results of a first to eighth condition 601 to 608 below in the simulation.

In the first condition 601, the first pitch p1 (corresponding to a period) is 200 nm, the first ratio θ1 is 0.2, the second pitch p2 (corresponding to a period) is 5 μm, the second ratio θ2 is 0.2, and the thickness t1 is 100 nm.

In the second condition 602, the first pitch p1 is 700 nm, the first ratio θ1 is 0.3, the second pitch p2 is 5 μm, the second ratio θ2 is 0.3, and the thickness t1 is 300 nm.

In the third condition 603, the first pitch p1 is 200 nm, the first ratio θ1 is 0.7, the second pitch p2 is 5 μm, the second ratio θ2 is 0.3, and the thickness t1 is 300 nm.

In the fourth condition 604, the first pitch p1 is 200 nm, the first ratio θ1 is 0.3, the second pitch p2 is 5 μm, the second ratio θ2 is 0.3, and the thickness t1 of is 700 nm.

In the fifth condition 605, the first pitch p1 is 200 nm, the first ratio θ1 is 0.3, the second pitch p2 is 500 nm, the second ratio θ2 is 0.3, and the thickness t1 of is 200 nm.

In the sixth condition 606, the first pitch p1 is 200 nm, the first ratio θ1 is 0.3, the second pitch p2 is 5 μm, the second ratio θ2 is 0.7, and the thickness t1 is 100 nm.

In the seventh condition 607, the first pitch p1 is 200 nm, the first ratio θ1 is 0.3, the second pitch p2 is 5 μm, the second ratio θ2 is 0.3, and the thickness t1 is 4 nm.

In the eighth condition 608, the first pitch p1 is 200 nm, the first ratio θ1 is 0.1, the second pitch p2 is 5 μm, the second ratio θ2 is 0.05, and the thickness t1 of is 50 nm.

Figure 8A:
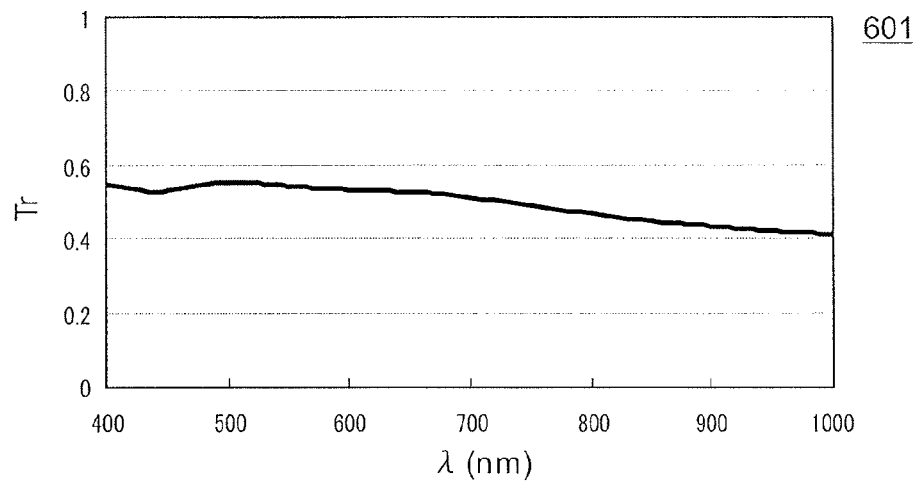
FIG. 8A to FIG. 8C, FIG. 9A to FIG. 9C, FIG. 10A, and FIG. 10B are graphs illustrating the characteristics of optically transmissive metal electrodes.

As illustrated in FIG. 8A, under the first condition 601, a high light transmittance Tr of 0.4 or more is obtained in a wide wavelength range. In the configuration under the first condition 601, in the case where Ag is used for the metal electrode layer 30, the sheet resistance $R_{sh}$ found by calculation is 0.8 ohm/square.

Figure 8B:
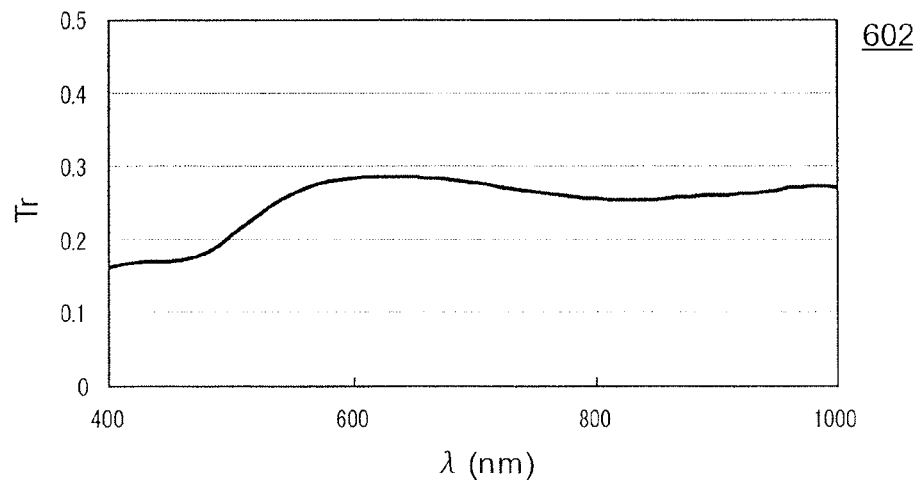

As illustrated in FIG. 8B, under the second condition 602, the light transmittance Tr is reduced at a wavelength λ of about 500 nm or less. Under the second condition 602, the first pitch p1 is 700 nm, and the light transmittance Tr is reduced at a wavelength λ shorter than the first pitch p1. In the configuration under the second condition 602, in the case where Au is used for the metal electrode layer 30, the sheet resistance $R_{sh}$ found by calculation is 0.3 ohm/square.

Figure 8C:
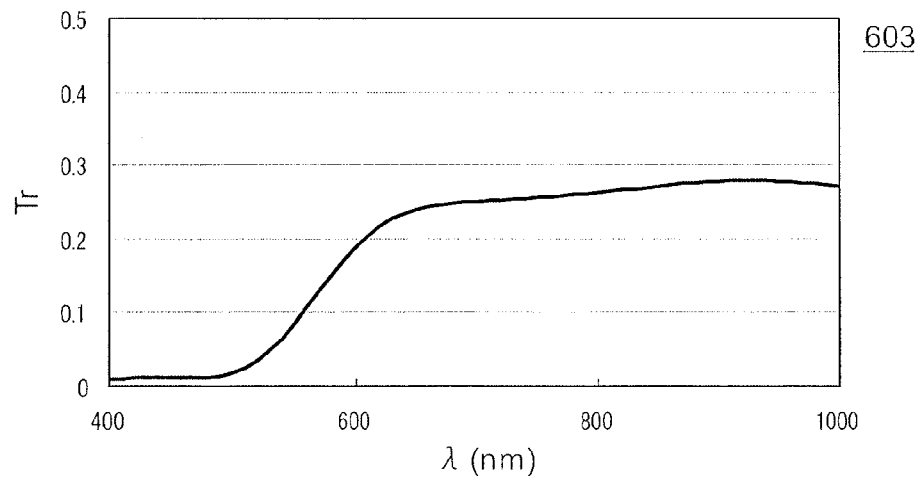

As illustrated in FIG. 8C, under the third condition 603, the light transmittance Tr is considerably reduced at a wavelength λ of about 500 nm or less. In the configuration under the third condition 603, in the case where Cu is used for the metal electrode layer 30, the sheet resistance $R_{sh}$ found by calculation is 0.2 ohm/square.

Figure 9A:
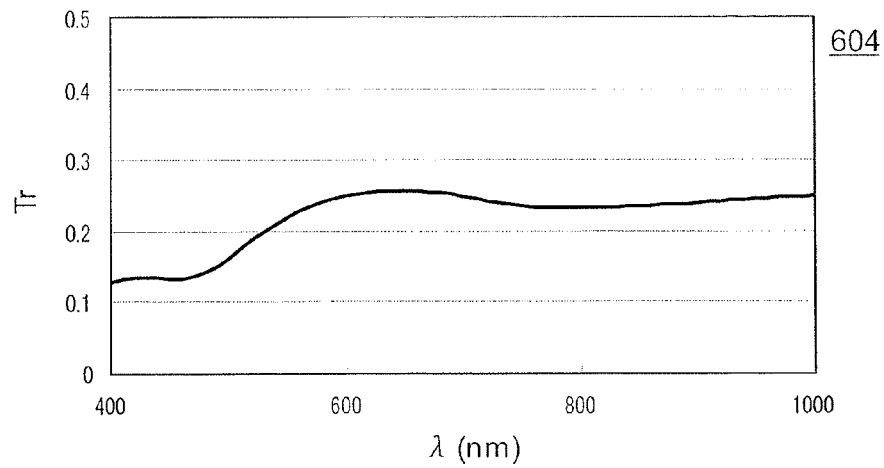

As illustrated in FIG. 9A, under the fourth condition 604, the light transmittance Tr is considerably reduced at a wavelength λ of about 500 nm or less. Under the fourth condition 604, the thickness t1 of is 700 nm, and the light transmittance Tr is reduced at a wavelength λ shorter than the thickness t1. In the configuration under the fourth condition 604, in the case where Au is used for the metal electrode layer 30, the sheet resistance $R_{sh}$ found by calculation is 0.1 ohm/square.

Figure 9B:
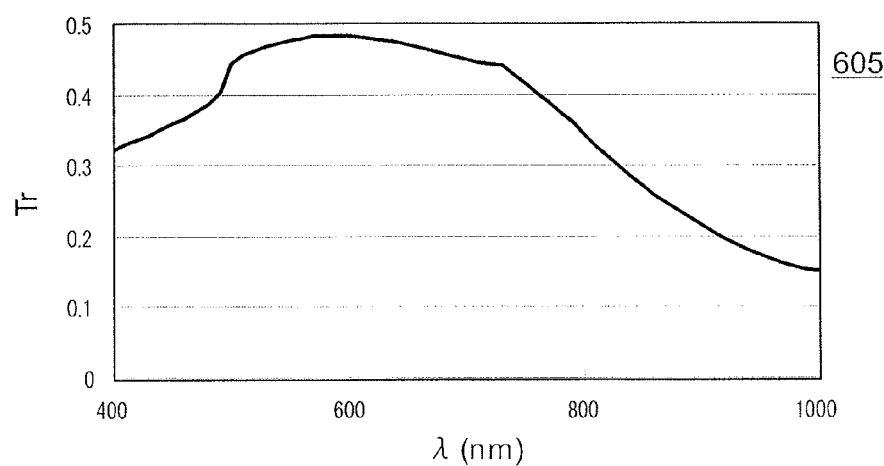

As illustrated in FIG. 9B, under the fifth condition 605, although the light transmittance Tr is high in a specific wavelength range of about 500 nm to about 700 nm, the light transmittance Tr is low in wavelength ranges other than the specific wavelength range. In the configuration under the fifth condition 605, in the case where Ag is used for the metal electrode layer 30, the sheet resistance $R_{sh}$ found by calculation is 0.3 ohm/square.

Figure 9C:
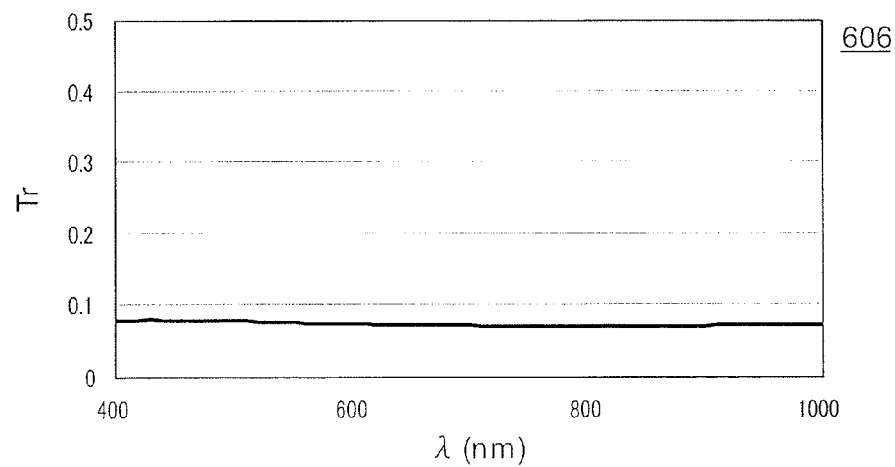

As illustrated in FIG. 9C, under the sixth condition 606, the light transmittance Tr is low in a wavelength range of 400 nm to 1 μm. Under the sixth condition 606, since the second ratio θ2 is as large as 0.7, the light transmittance Tr is reduced because the metal electrode 30 is covered in a large area. In the configuration under the sixth condition 606, in the case where Ni is used for the metal electrode layer 30, the sheet resistance $R_{sh}$ found by calculation is 2.3 ohm/square.

Figure 10A:
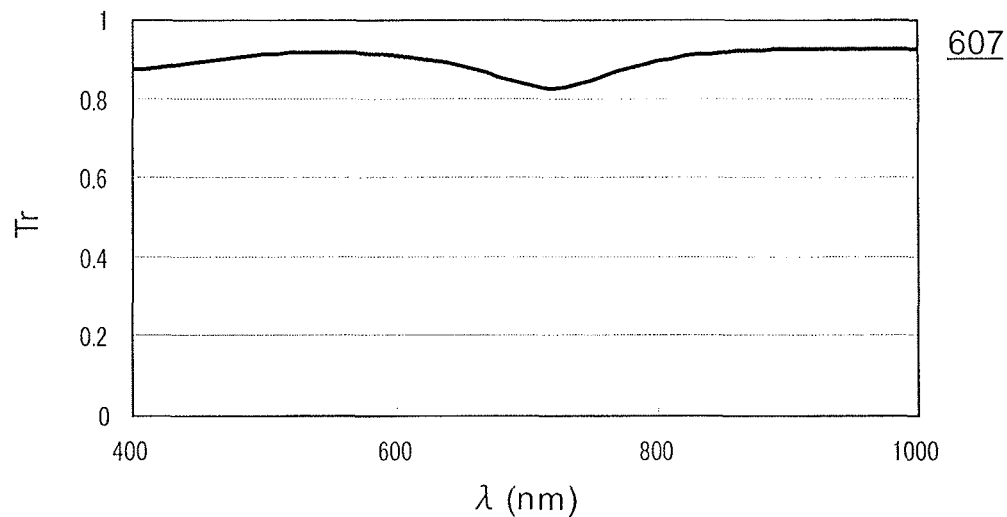

As illustrated in FIG. 10A, under the seventh condition 607, a high light transmittance Tr can be obtained in a wavelength range of 400 nm to 1 μm. Under the seventh condition 607, the thickness t1 is as thin as 4 nm. In the configuration under the seventh condition 607, in the case where Au is used for the metal electrode layer 30, the sheet resistance $R_{sh}$ found by calculation is considerably as high as 20 ohm/square.

Figure 10B:
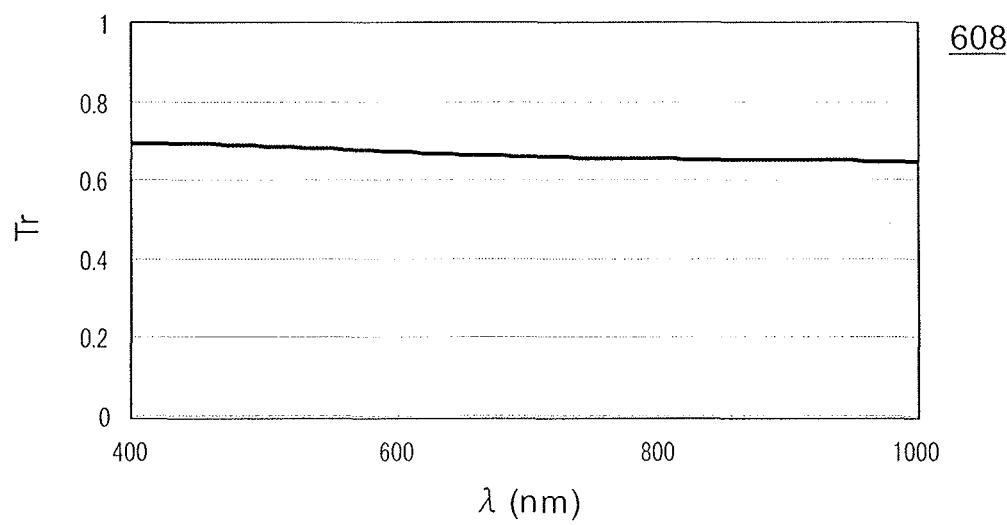

As illustrated in FIG. 10B, also under the eighth condition 608, a high light transmittance Tr can be obtained in a wavelength range of 400 nm to 1 μm. Under the eighth condition 608, the second ratio θ2 is considerably as small as 0.05. In the configuration under the eighth condition 608, in the case where Ni is used for the metal electrode layer 30, the sheet resistance $R_{sh}$ found by calculation is considerably as high as 28 ohm/square.

As described above, in the optically transmissive metal electrode 310 according to the embodiment, such settings are provided in which the first pitch p1 is the shortest wavelength λ1 or less, the second pitch p2 exceeds the longest wavelength λ2, and the thickness t1 is the shortest wavelength λ1 or less, so that it is possible to provide an optically transmissive metal electrode having a low sheet resistance and a high transmittance in a wide wavelength range.

Figure 11:
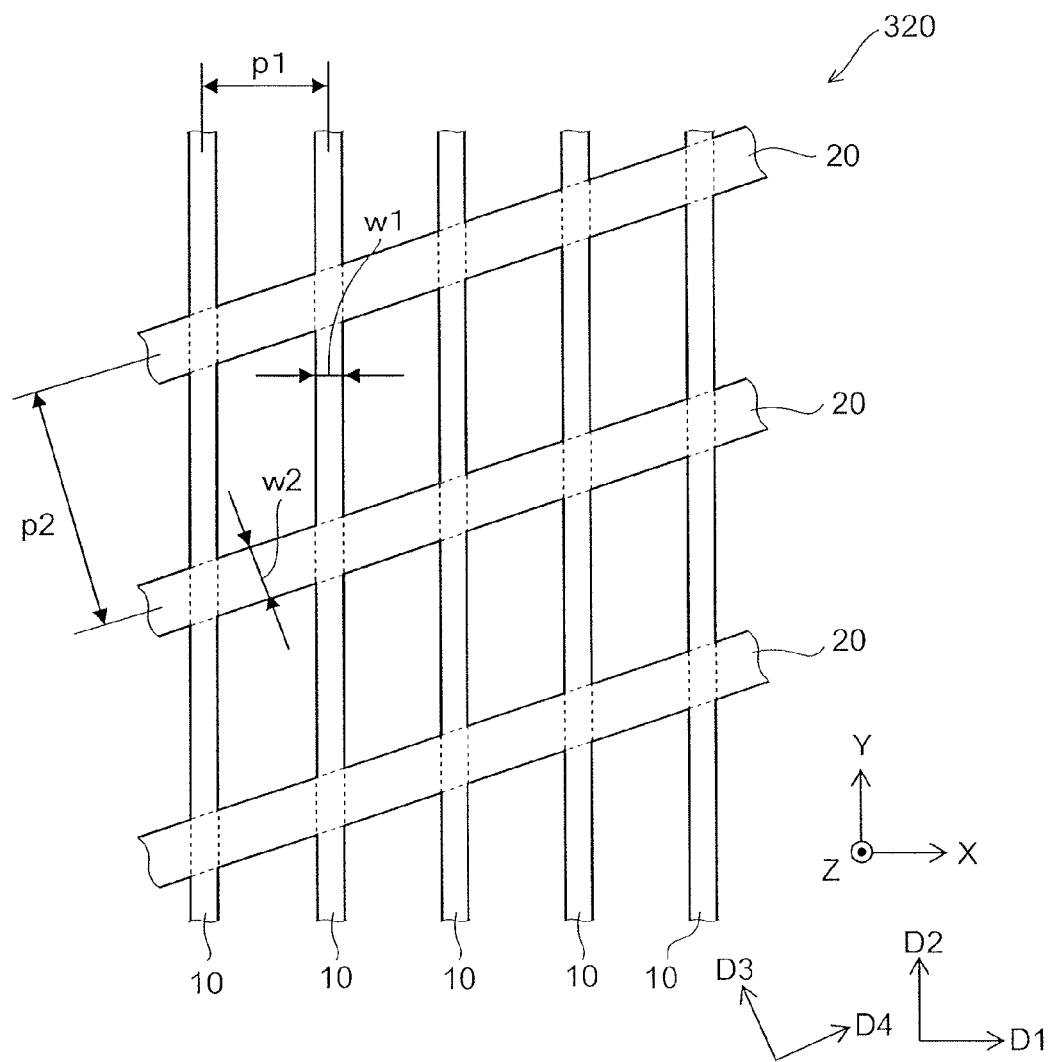
FIG. 11 is a schematic plan view illustrating another optically transmissive metal electrode according to the first embodiment.

FIG. 11 is a schematic plan view illustrating the configuration of another optically transmissive metal electrode according to the first embodiment.

As illustrated in FIG. 11, an optically transmissive metal electrode 320 according to the embodiment also includes a plurality of first metal wires 10 and a plurality of second metal wires 20. In this example, the third direction D3 is tilted, not vertical to the first direction D1 (for example, the X-axis direction), and the fourth direction D4 is tilted, not vertical to the second direction D2 (for example, the Y-axis direction). Since the configuration other than these is the same as the configuration of the optically transmissive metal electrode 310, the description is omitted. Also according to the optically transmissive metal electrode 320, it is possible to provide an optically transmissive metal electrode having a low sheet resistance and a high transmittance in a wide wavelength range.

Figure 12:
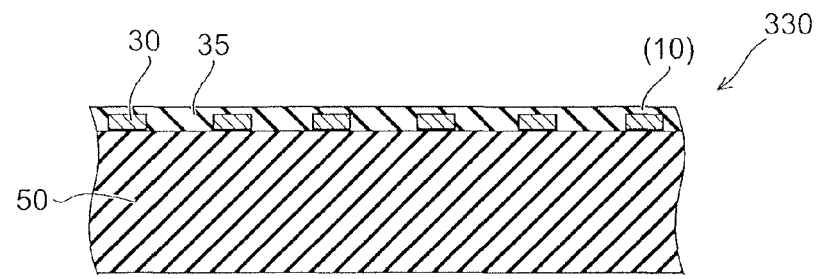
FIG. 12 is a schematic cross-sectional view illustrating another optically transmissive metal electrode according to the first embodiment.

FIG. 12 is a schematic cross-sectional view illustrating the configuration of still another optically transmissive metal electrode according to the first embodiment.

FIG. 12 is a cross-sectional view corresponding to the cross section on the line A1-A2 in FIG. 1.

As illustrated in FIG. 12, an optically transmissive metal electrode 330 according to the embodiment includes a metal electrode layer 30 including a first metal wire 10 and a second metal wire 20. The optically transmissive metal electrode 330 further includes a thin film layer 35.

The thin film layer 35 contacts the first metal wires 10 and the second metal wires 20. The thin film layer 35 includes a material different from the materials of the first metal wires 10 and the second metal wires 20. In this example, the thin film layer 35 covers the first metal wires 10 and the second metal wires 20. However, the thin film layer 35 may be formed on at least one of the gap between the first metal wires 10, the gap between the second metal wires 20, the first metal wires 10, and the second metal wires 20.

The thin film layer 35 is provided, so that the mechanical strengths of the first metal wires 10 and the second metal wires 20 are improved. The thin film layer 35 is optically transparent. The thin film layer 35 has insulating properties. An organic or inorganic material is used for the thin film layer 35.

In the following, some examples of the embodiment will be described.

First Example

A silver layer is formed in a thickness of 100 nm on a silica substrate by vacuum evaporation. A liquid solution that a resist (THMR-iP3250 made by TOKYO OHOKA KOGYO Co., Ltd.) was diluted with ethyl lactate (EL) at 1:2 (resist: EL=1:2) is prepared. This liquid solution is spin-coated on the silver layer at 2,800 rpm for 35 seconds. Subsequently, the solvent is heated on a hot plate at a temperature of 100° C. for 90 seconds for evaporation. Thus, a resist film is formed. The thickness of the resist film is 170 nm.

A silica mold is prepared. A plurality of projections are provided on a single surface (a transfer surface) of the silica mold. A single projection substantially has a rectangular shape when seen along the normal of the transfer surface. In this example, the length (the length along the first axis) of the short side of the rectangle is 160 nm, and the length (the length along the second axis vertical to the first axis) of the long side is 4 μm. The plurality of projections are arranged at a period of 200 nm along the first axis and at a period of 5 μm along the second axis. The height of the projection is 200 nm. In the state in which the substrate with the resist film is heated at a temperature of 125° C., thermal nanoimprinting is performed by pressing the transfer surface of the silica mold against the resist film at a pressure of 20 MPa. After thermal nanoimprinting, the substrate is cooled to ambient temperature, and the silica mold is released. After thermal nanoimprinting, a recessed pattern is formed on the resist film, having a length of 160 nm along the first axis, a period of 200 nm along the first axis, a length of 4 μm along the second axis, a period of 5 μm along the second axis, and a depth of 190 nm.

The resist film formed with the recessed pattern is subjected to reactive ion etching (RIE) for 60 seconds under the conditions with a $CF_4$ gas flow of 30 sccm at 10 mTorr at an RF power of 100 W. The silver film is exposed by $CF_4$ RIE. An ion milling device is used to etch the silver layer for 180 seconds under the conditions with an accelerating voltage of 500 V and an ion current of 40 mA. After the etching, an ultrasonic cleaning by acetone dipping is performed for removing the resist film. Thus, an optically transmissive metal electrode 310 can be obtained.

The sheet resistance $R_{sh}$ of the optically transmissive metal electrode 310 is 0.8 ohm/square. The light transmittance Tr of this optically transmissive metal electrode 310 is 40 percent or more and 55 percent or less for a wavelength of 400 nm or more and 1000 nm or less.

Second Example

A gold layer is formed in a thickness of 300 nm on a silica substrate by vacuum evaporation. A resist film is formed on the silica substrate using a similar method as the method of the first example. The thickness of the resist film is 170 nm. In this example, the length of a single projection of a silica mold along the first axis is 270 nm, and the length along the second axis is 6.8 µm crosswise. A plurality of projections are arranged at a period of 300 nm along the first axis and at a period of 8 µm along the second axis. The height of the projection is 200 nm. In the state in which the substrate with the resist film is heated at a temperature of 125° C., thermal nanoimprinting is performed by pressing the transfer surface of the silica mold against the resist film at a pressure of 20 MPa. After the substrate is cooled to ambient temperature and the silica mold is released, a recessed pattern is formed on the resist film, having a length of 270 nm along the first axis, a period of 300 nm along the first axis, a length of 6.8 µm along the second axis, at a period of 8 µm along the second axis, and a depth of 190 nm.

The resist film formed with the recessed pattern is etched for 70 seconds under the conditions with an $O_2$ gas flow of 30 sccm at 1.3 Pa at an RF power of 100 W. The gold film is exposed by $O_2$ RIE. An ion milling device is used to etch the gold layer for 600 seconds under the conditions with an accelerating voltage of 500 V and an ion current of 40 mA. After the etching, in order to remove the resist film, the resist film is etched for 180 seconds under the conditions that an $O_2$ gas flow of 30 sccm at 13.3 Pa at an RF power of 100 W. Thus, an optically transmissive metal electrode 310 can be obtained.

The sheet resistance $R_{sh}$ of this optically transmissive metal electrode 310 is 0.9 ohm/square. The light transmittance Tr of this optically transmissive metal electrode 310 is 35 percent or more and 46 percent or less for a wavelength of 400 nm or more and 1000 nm or less.

Third Example

A copper layer is formed in a thickness of 100 nm on a silica substrate by vacuum evaporation. A resist film is formed using a similar method as the method of the first example. The thickness of the resist film is 150 nm. In this example, the length of a single projection of a silica mold along the first axis is 70 nm, and the length along the second axis is 7.2 µm. A plurality of projections are arranged at a period of 100 nm along the first axis and at a period of 9 µm along the second axis. The height of the projection is 150 nm. In the state in which the substrate with the resist film is heated at a temperature of 125° C., thermal nanoimprinting is performed by pressing the transfer surface of the silica mold against the resist film at a pressure of 40 MPa. After the substrate is cooled to ambient temperature and the silica mold is released, a recessed pattern is formed on the resist film, having a length of 70 nm along the first axis, a period of 100 nm along the first axis, a length of 7.2 µm along the second axis, a period of 9.0 µm along the second axis, and a depth of 140 nm.

The resist film formed with the recessed pattern is subjected to reactive ion etching for 50 seconds under the conditions with a $CF_4$ gas flow of 30 sccm at 10 mTorr at an RF power of 100 W. The copper film is exposed by $CF_4$ RIE. An ion milling device is used to etch the copper layer for 180 seconds under the conditions with an accelerating voltage of 500 V and an ion current of 40 mA. After the etching, an ultrasonic cleaning by acetone dipping is performed for removing the resist film. Thus, an optically transmissive metal electrode 310 is produced.

The sheet resistance $R_{sh}$ of this optically transmissive metal electrode 310 is 1.0 ohm/square. The light transmittance Tr of this optically transmissive metal electrode 310 is 35 percent or more and 45 percent or less for a wavelength of 400 nm or more and 1000 nm or less.

Fourth Example

An aluminum layer is formed in a thickness of 100 nm on a silica substrate by vacuum vapor deposition. A resist film is formed using a similar method as the method of the first example. The thickness of the resist film is 170 nm. In this example, the length of a single projection of a silica mold along the first axis is 320 nm, and the length along the second axis is 2.4 µm. A plurality of projections are arranged at a period of 400 nm along the first axis and at a period 3 µm along the second axis. The height of the projection is 200 nm. In the state in which the substrate with the resist film is heated at a temperature of 125° C., thermal nanoimprinting is performed by pressing the transfer surface of the silica mold against the resist film at a pressure of 20 MPa. After the substrate is cooled to ambient temperature and the silica mold is released, a recessed pattern is formed on the resist film, having a length of 320 nm along the first axis, a period of 400 nm along the first axis, a length of 2.4 µm along the second axis, at a period of 3 µm along the second axis, and a depth of 170 nm.

After the remaining resist film is removed using a reactive etching device, the aluminum layer is etched by chlorine plasma etching. The remaining resist film is removed with acetone. Thus, an optically transmissive metal electrode 310 is produced.

The sheet resistance $R_{sh}$ of this optically transmissive metal electrode 310 is 1.1 ohm/square. The light transmittance Tr of this optically transmissive metal electrode 310 is 35 percent or more and 40 percent or less for a wavelength of 400 nm or more and 1000 nm or less.

Fifth Example

A gold layer is formed in a thickness of 300 nm on an n-Ga P-substrate by vacuum vapor deposition. A resist film is formed as similar to the first example. The thickness of the resist film is 150 nm. In this example, the length of a single projection of a silica mold along the first axis is 70 nm, and the length along the second axis is 3.5 µm. A plurality of projections are arranged at a period of 100 nm along the first axis and at a period 5 µm along the second axis. The height of the projection is 150 nm. In the state in which the substrate with the resist film is heated at a temperature of 125° C., thermal nanoimprinting is performed by pressing the transfer surface of the silica mold against the resist film at a pressure of 20 MPa. After the substrate is cooled to ambient temperature and the silica mold is released, a recessed pattern is formed on the resist film, having a length of 320 nm along the first axis, a period of 400 nm along the first axis, a length of 3.5 µm along the second axis, a period of 5 µm along the second axis, and a depth of 140 nm.

After the remaining resist film is removed using a reactive etching device, the gold layer is etched by ion milling. The remaining resist film is removed with acetone. Thus, an optically transmissive metal electrode 310 is produced.

The sheet resistance $R_{sh}$ of this optically transmissive metal electrode 310 is 1.1 ohm/square, for example. The light transmittance Tr of this optically transmissive metal electrode 310 is 35 percent or more and 40 percent or less for a wavelength of 400 nm or more and 1000 nm or less.

Second Embodiment

The embodiment relates to an electronic device. The electronic device includes a semiconductor light emitting device, a photoelectric converter, a display device, and the like, for example. In the electronic device according to the embodiment, a given optically transmissive metal electrode (including the optically transmissive metal electrodes 310, 320, and 330, for example) according to the first embodiment and a modification thereof can be used. In the following, an explanation will be given for an example where the optically transmissive metal electrode 310 is used.

Figure 13:
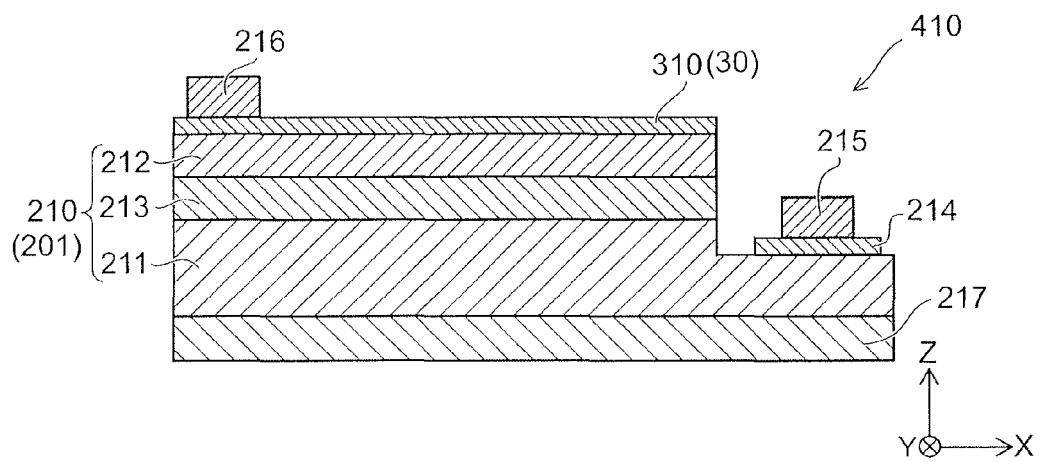
FIG. 13 is a schematic cross-sectional view illustrating an electronic device according to a second embodiment.

FIG. 13 is a schematic cross-sectional view illustrating the configuration of an electronic device according to a second embodiment.

As illustrated in FIG. 13, an electronic device 410 (a semiconductor light emitting device) according to the embodiment includes the optically transmissive metal electrode according to the first embodiment 310 and a structure unit 201.

The structure unit 201 is supplied with electric charges through the optically transmissive metal electrode 310. Namely, a current is carried to the structure unit 201 through the optically transmissive metal electrode 310. A voltage is applied to the structure unit 201 based on the electric charges supplied through the optically transmissive metal electrode 310.

In this example, the structure unit 201 has a stacked body 210. The stacked body 210 is supplied with electric charges through the optically transmissive metal electrode 310. The stacked body 210 includes a first semiconductor layer 211 of a first conductive type, a second semiconductor layer 212 of a second conductive type, and a light emitting portion 213. The second semiconductor layer 212 is stacked on the first semiconductor layer 211 along the Z-axis direction (in the normal direction of the X-Y plane). The light emitting portion 213 is provided between the first semiconductor layer 211 and the second semiconductor layer 212. The light emitting portion 213 emits light based on the electric charges supplied through the optically transmissive metal electrode 310.

Here, in the specification, the state of being stacked includes a state in which a layer is directly laid on another layer as well as a state in which layers are laid on each other as another element is inserted therebetween.

For example, the first conductive type is an n-type, and the second conductive type is a p-type. It is noted that the first conductive type may be a p-type, and the second conductive type may be an n-type. In this example, the first semiconductor layer 211 is an n-type, and the second semiconductor layer 212 is a p-type. The electronic device 410 is a semiconductor light emitting device such as an LED (Light Emitting Diode) and LD (Laser Diode).

In this example, the optically transmissive metal electrode 310 is provided to contact the second semiconductor layer 212. A first semiconductor layer electrode 214 is provided on the first semiconductor layer 211. A first pad 215 is provided on the first semiconductor layer electrode 214. A second pad 216 is provided on the optically transmissive metal electrode 310.

In this example, a substrate 217 to grow semiconductor layers thereon is further provided. The substrate 217 may be removed.

Electrons and holes injected from the electrodes to the light emitting portion 213 are recombined at the light emitting portion 213 for emitting light. This light is transmitted through the optically transmissive metal electrode 310, and emitted to the outside of the electronic device 410. The peak wavelength of the light emitted from the light emitting portion 213 is the shortest wavelength λ1 or more and the longest wavelength λ2 or less as explained for the optically transmissive metal electrode 310, for example.

It is effective to increase an injected current in order to increase the intensity of the light emitted from the semiconductor light emitting device. For example, in the case of using an oxide transparent electrode, the luminance has a peak at a certain current value in the current-luminance characteristics, and the luminance is reduced when a current having the value or more is carried. This is because a current cannot be uniformly injected due to a high resistivity of the oxide transparent electrode for no uniform light emission.

At this time, in the embodiment, the optically transmissive metal electrode 310 having a low sheet resistance and a high transmittance in a wide wavelength range is used, so that it is possible to suppress a reduction in the luminance caused by current concentration. In accordance with the electronic device 410 (the semiconductor light emitting device) according to the embodiment, it is possible to provide a highly efficient semiconductor light emitting device with a high luminance. Furthermore, it is possible to provide a large-area semiconductor light emitting device.

Figure 14:
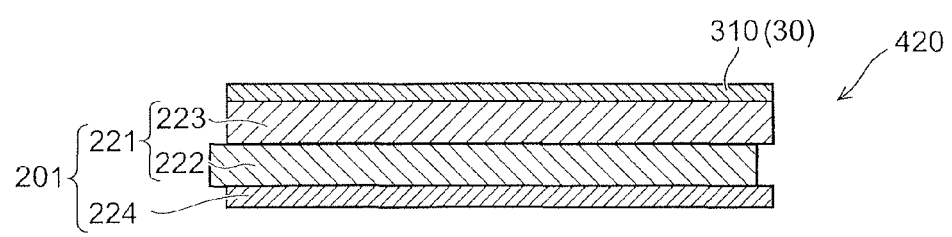
FIG. 14 is a schematic cross-sectional view illustrating another electronic device according to the second embodiment.

FIG. 14 is a schematic cross-sectional view illustrating the configuration of another electronic device according to the second embodiment. An electronic device 420 illustrated in FIG. 14 is a photoelectric converter. The electronic device 420 includes the optically transmissive metal electrode 310 and a structure unit 201 supplied with electric charges through the optically transmissive metal electrode 310.

The structure unit 201 includes an active layer 221 that converts incident light into electric energy. The active layer 221 includes a p-type layer 222 and an n-type layer 223 stacked on the p-type layer 222, for example. The structure unit 201 further includes a counter electrode 224. The active layer 221 is disposed between the optically transmissive metal electrode 310 and the counter electrode 224.

The electronic device 420 is a solar cell, for example. In the electronic device 420, light is externally applied to the active layer 221 through the optically transmissive metal electrode 310.

The applied light separates carriers in the active layer 221 to produce a voltage. In this separation and production, a current based on electric charges produced in the active layer 221 can be extracted from the optically transmissive metal electrode 310 to a circuit, not shown. In this extraction, the active layer 221 is supplied with electric charges (electric charges having polarity reverse to the polarity of the current) corresponding to the current through the counter electrode 224.

According to the electronic device 420, the optically transmissive metal electrode 310 having a low sheet resistance and a high transmittance in a wide wavelength range is used, so that it is possible to provide a highly efficient, large-area photoelectric converter.

Figure 15:
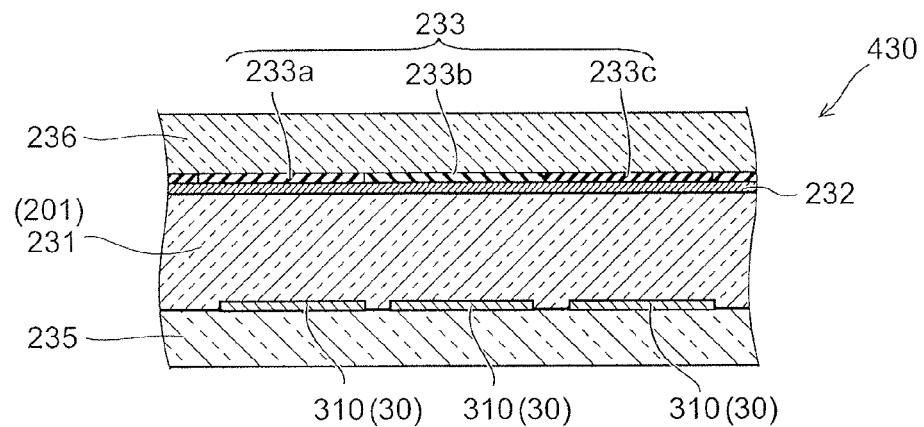
FIG. 15 is a schematic cross-sectional view illustrating another electronic device according to the second embodiment.

FIG. 15 is a schematic cross-sectional view illustrating the configuration of still another electronic device according to the second embodiment. An electronic device 430 illustrated in FIG. 15 is a display device. In this example, liquid crystals are used in the display device. The electronic device 430 includes the optically transmissive metal electrode 310 and a structure unit 201 supplied with electric charges through the optically transmissive metal electrode 310.

The structure unit 201 includes an optical layer 231. In this example, in the optical layer 231, optical characteristics including at least one of form birefringence, optical activity, scattering, diffraction, and absorption are changed. Liquid crystals are used for the optical layer 231.

More specifically, the optically transmissive metal electrode 310 is provided on a first substrate 235. The optically transmissive metal electrode 310 is spilt for each pixel, for example. The optically transmissive metal electrode 310 to be a plurality of pixel electrodes is connected to a thin film transistor, not shown, or the like. On the other hand, a color filter 233 (a red, green, and blue color filter 233*a*, 233*b*, and 233*c*, for example), for example, is provided on a second substrate 236. A counter electrode 232 is provided on the color filter 233. The liquid crystal layer (the optical layer 231) is disposed between the optically transmissive metal electrode 310 and the counter electrode 232.

The pixel electrode (the optically transmissive metal electrode 310) is supplied with electric charges from a driver, not shown, and a voltage is produced across the pixel electrode and the counter electrode. The optical characteristics of the liquid crystal layer (the optical layer 231) are changed according to this voltage. Changes in the optical characteristics are used for the transmittance of light using a polarizing device, not shown, for example, or the like.

In the electronic device 430, the optically transmissive metal electrode 310 having a low sheet resistance and a high transmittance in a wide wavelength range is used, so that it is possible to obtain excellent display characteristics.

The optically transmissive metal electrode 310 may be used for the counter electrode 232. The color filter may be provided on the first substrate 235.

A layer that emits light based on electric charges supplied through the optically transmissive metal electrode 310 may be used for the optical layer 231. For example, the optical layer 231 can include an organic light emitting layer. For example, the optically transmissive metal electrode 310 can also be used in an organic electroluminescent display device.

Figure 16:
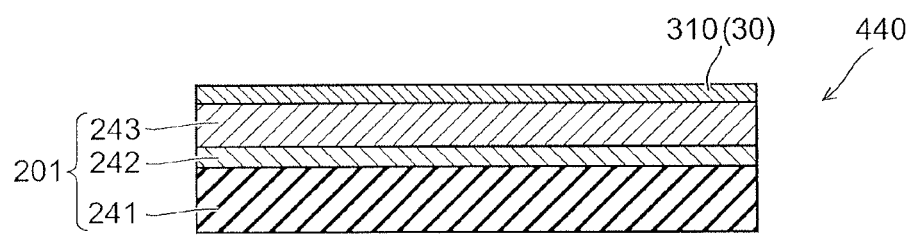
FIG. 16 is a schematic cross-sectional view illustrating another electronic device according to the second embodiment.

FIG. 16 is a schematic cross-sectional view illustrating the configuration of yet another electronic device according to the second embodiment. An electronic device 440 illustrated in FIG. 16 is a light emitting device. In this example, an organic light emitting layer is used in the light emitting device. The electronic device 440 includes the optically transmissive metal electrode 310 and a structure unit 201 supplied with electric charges through the optically transmissive metal electrode 310. The electronic device 440 is an electroluminescent device, for example.

The structure unit 201 includes a substrate 241, an electrode layer 242 provided on the substrate 241, and a light emitting layer 243 provided on the electrode layer 242. The optically transmissive metal electrode 310 is provided on the light emitting layer 243 of the structure unit 201.

The light emitting layer 243 is supplied with electric charges through the optically transmissive metal electrode 310, and light is emitted at the light emitting layer 243. The light is emitted to the outside through the optically transmissive metal electrode 310.

In the electronic device 440, the optically transmissive metal electrode 310 having a low sheet resistance and a high transmittance in a wide wavelength range is used, so that it is possible to obtain a high luminance and a high efficiency. Furthermore, it is possible to obtain uniform light emission intensity also in a large area. The electronic device 440 is used for a lighting system, for example, or the like.

Third Embodiment

A third embodiment relates to an optical device. In the optical device according to the embodiment, a given optically transmissive metal electrode (including the optically transmissive metal electrodes 310, 320, and 330, for example) according to the first embodiment and a modification thereof can be used. In the following, an explanation will be given for an example where the optically transmissive metal electrode 310 is used.

Figure 17:
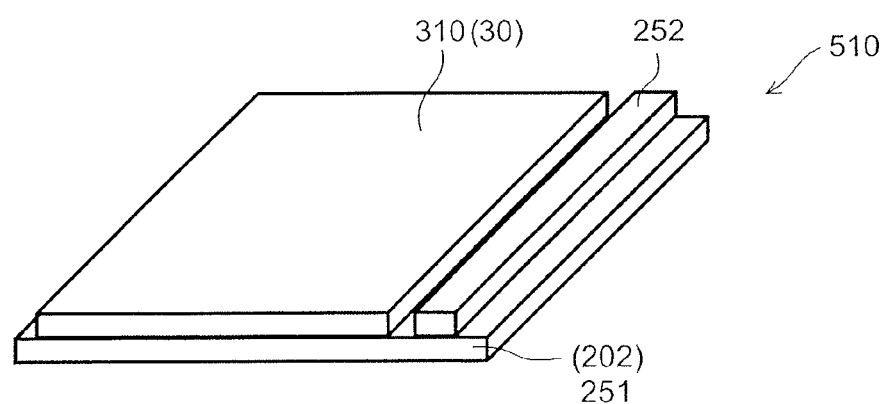
FIG. 17 is a schematic perspective view illustrating the optical device according to a third embodiment.

FIG. 17 is a schematic perspective view illustrating the configuration of the optical device according to the third embodiment.

As illustrated in FIG. 17, an optical device 510 according to the embodiment includes the optically transmissive metal electrode 310 and an optical member 202. The optically transmissive metal electrode 310 is stacked on the optical member 202. The optical member 202 receives light transmitted through the optically transmissive metal electrode 310. In this example, the optical device 510 is a touch panel.

A substrate 251 is used in the optical member 202. The optically transmissive metal electrode 310 is provided on the substrate 251. A driver 252 is further provided on the substrate 251. The optical device 510 (the touch panel) may further include a counter electrode (not shown) apart from the optically transmissive metal electrode 310 while the counter electrode is faced to the optically transmissive metal electrode 310. In the optical device 510 (the touch panel), a resistance variation method or a capacitance method is used, for example.

In the optical device 510 (the touch panel), the optically transmissive metal electrode 310 having a low sheet resistance and a high transmittance in a wide wavelength range is used, so that it is possible to improve contact sensitivity without impairing transparency.

Figure 18:
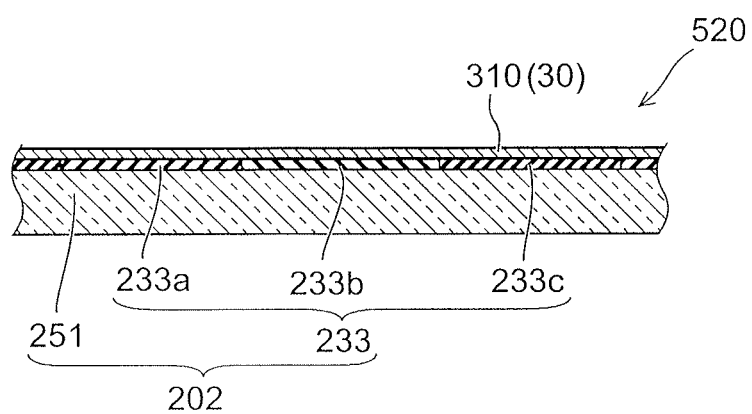
FIG. 18 is a schematic cross-sectional view illustrating another optical device according to the third embodiment.

FIG. 18 is a schematic cross-sectional view illustrating the configuration of another optical device according to the third embodiment. As illustrated in FIG. 18, an optical device 520 according to the embodiment is a color filter, for example. The optical device 520 includes the optically transmissive metal electrode 310 and an optical member 202. The optical member 202 includes a color filter 233 (a red, green, and blue color filter 233*a*, 233*b*, and 233*c*, for example). The optical member 202 can further include a substrate 251. The color filter 233 is provided on the substrate 251, and the optically transmissive metal electrode 310 is provided on the color filter 233.

The optical device 520 (the color filter) is used in a liquid crystal display device, for example, or the like. The optically transmissive metal electrode 310 having a low sheet resistance and a high transmittance in a wide wavelength range is used, so that it is possible to obtain excellent display characteristics.

According to the embodiments, it is possible to provide an optically transmissive metal electrode, an electronic device, and an optical device having a low sheet resistance and a high transmittance in a wide wavelength range.

Hereinabove, the embodiments of the invention are described with reference to the specific examples. However, the invention is not limited to these specific examples. As for the specific configurations of components such as the first metal wire, the second metal wire, and the thin film layers included in the optically transmissive metal electrode, for example, they are included in the scope of the invention as long as a person skilled in the art may appropriately select them from a publicly known range and similarly implement the invention for obtaining similar effects.

Further, any two or more components of the specific examples may be combined within the extent of technical feasibility and are included in the scope of the invention to the extent that the purport of the invention is included.

In addition to this, all optically transmissive metal electrodes, electronic devices, and optical devices that can be implemented by a person skilled in the art to appropriately modify and alter design based on the foregoing optically transmissive metal electrodes, electronic devices, and optical devices as an embodiment of the invention are also included in the scope of the invention as long as they include the teachings of the invention.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An optically transmissive metal electrode comprising:
   a plurality of first metal wires disposed side by side along a first direction, each of the first metal wires extending along a second direction intersecting the first direction; and
   a plurality of second metal wires disposed side by side along a third direction parallel with a plane including the first direction and the second direction and intersecting the first direction, the second metal wires contacting the first metal wires, each of the second metal wires extending along a fourth direction parallel with the plane and intersecting the third direction,
   a first pitch between centers of the first metal wires in the first direction being not more than a shortest wavelength in a waveband including visible light,
   a second pitch between centers of the second metal wires in the third direction exceeding a longest wavelength in the waveband,
   a thickness of the first metal wires and the second metal wires along a direction vertical to the plane being not more than the shortest wavelength or less.

2. The electrode according to claim 1, wherein the shortest wavelength is 400 nanometers, and the longest wavelength is 700 nanometers.

3. The electrode according to claim 1, wherein the first pitch is 10 nanometers or more and 400 nanometers or less, and a ratio of a width of each of the first metal wires to the first pitch along the first direction is 0.1 or more and 0.5 or less.

4. The electrode according to claim 1, wherein the second pitch is 1 micrometer or more and less than 10 micrometers, and a ratio of a width of each of the second metal wires to the second pitch along the third direction is 0.1 or more and 0.5 or less.

5. The electrode according to claim 1, wherein the thickness is 5 nanometers or more and 400 nanometers or less.

6. The electrode according to claim 1, wherein the first metal wires and the second metal wires include at least one of gold, silver, copper, aluminum, nickel, lead, zinc, platinum, cobalt, magnesium, chromium, tungsten, and palladium.

7. The electrode according to claim 1, wherein variations in the first width are within plus or minus 25 percent for a mean value of the first width.

8. The electrode according to claim 1, wherein variations in the second width are within plus or minus 5 percent for a mean value of the second width.

9. The electrode according to claim 1, further comprising:
   a thin film layer contacting the first metal wires and the second metal wires, the thin film layer including a material different from a material of the first metal wires and a material of the second metal wires.

10. The electrode according to claim 1, wherein a sheet resistance of the optically transmissive metal electrode is 5 ohm/square or less.

11. An electronic device comprising:
    an optically transmissive metal electrode; and
    a structure unit supplied with electric charges through the optically transmissive metal electrode,
    the optically transmissive metal electrode including:
      a plurality of first metal wires disposed side by side along a first direction, each of the first metal wires extending along a second direction intersecting the first direction; and
      a plurality of second metal wires disposed side by side along a third direction parallel with a plane including the first direction and the second direction and intersecting the first direction, the second metal wires contacting the first metal wires, each of the second metal wires extending along a fourth direction parallel with the plane and intersecting the third direction,
      a first pitch between centers of the first metal wires in the first direction being not more than a shortest wavelength in a waveband including visible light,
      a second pitch between centers of the second metal wires in the third direction exceeding a longest wavelength in the waveband,
      a thickness of the first metal wires and the second metal wires along a direction vertical to the plane being not more than the shortest wavelength.

12. The device according to claim 11, wherein the first pitch is 10 nanometers or more and 400 nanometers or less, and a ratio of a width of each of the first metal wires to the first pitch along the first direction is 0.1 or more and 0.5 or less.

13. The device according to claim 11, wherein the second pitch is 1 micrometer or more and less than 10 micrometers, and a ratio of a width of each of the second metal wires to the second pitch along the third direction is 0.1 or more and 0.5 or less.

14. The device according to claim 11, wherein the thickness is 5 nanometers or more and 400 nanometers or less.

15. The device according to claim 11,
wherein the first metal wires and the second metal wires include at least one of gold, silver, copper, aluminum, nickel, lead, zinc, platinum, cobalt, magnesium, chromium, tungsten, and palladium.

16. The device according to claim 11,
wherein a sheet resistance of the optically transmissive metal electrode is 5 ohm/square or less.

17. The device according to claim 11, wherein
the structure unit has a stacked body supplied with the electric charges, and
the stacked body includes:
  a first semiconductor layer of a first conductive type;
  a second semiconductor layer of a second conductive type stacked on the first semiconductor layer along a normal direction of the plane; and
  a light emitting portion provided between the first semiconductor layer and the second semiconductor layer to emit light based on the electric charges.

18. The device according to claim 11, wherein
the structure unit includes an active layer to convert incident light into an electric signal, and
the metal electrode is carried through a current including the electric signal.

19. The device according to claim 11,
wherein the structure unit includes at least one of an optical layer to emit light based on the electric charges and an optical layer having optical characteristics that are changed based on the electric charges, the optical characteristics including at least one of form birefringence, optical activity, scattering, diffraction, and absorption.

20. An optical device comprising:
an optically transmissive metal electrode; and
an optical member stacked on the optically transmissive metal electrode, the optical member receiving light transmitted through the optically transmissive metal electrode,
the optically transmissive metal electrode including:
  a plurality of first metal wires disposed side by side along a first direction, each of first metal wires extending along a second direction intersecting the first direction; and
  a plurality of second metal wires disposed side by side along a third direction parallel with a plane including the first direction and the second direction and intersecting the first direction, the second metal wires contacting the first metal wires, each of the second metal wires extending along a fourth direction parallel with the plane and intersecting the third direction,
  a first pitch between centers of the first metal wires in the first direction being not more than a shortest wavelength in a waveband including visible light or less,
  a second pitch between centers of the second metal wires in the third direction exceeding a longest wavelength in the waveband,
  a thickness of the first metal wires and the second metal wires along a direction vertical to the plane being not more than the shortest wavelength or less.

* * * * *